(12) United States Patent
Goren et al.

(10) Patent No.: US 6,498,532 B2
(45) Date of Patent: Dec. 24, 2002

(54) SYSTEM AND METHOD FOR LINEARIZING VACUUM ELECTRONIC AMPLIFICATION

(75) Inventors: Yehuda G. Goren, Palo Alto, CA (US); Charles E. Jensen, Carmichael, CA (US); Donald R. Gagne, Placerville, CA (US); Tong Chen, Mountain View, CA (US); Philip M. Lally, Palo Alto, CA (US)

(73) Assignee: Teledyne Technologies Incorporated, Los Angeles, CA (US)

( * ) Notice: Subject to any disclaimer, the term of this patent is extended or adjusted under 35 U.S.C. 154(b) by 20 days.

(21) Appl. No.: 09/759,736

(22) Filed: Jan. 12, 2001

(65) Prior Publication Data

US 2002/0093379 A1 Jul. 18, 2002

(51) Int. Cl.[7] .................................. H03F 3/58
(52) U.S. Cl. ........................ 330/43; 330/149; 315/39.3
(58) Field of Search ................. 330/43, 149; 315/39.3, 315/3.5

(56) References Cited

U.S. PATENT DOCUMENTS

| | | | |
|---|---|---|---|
| 3,119,969 A | | 1/1964 | Cayzac et al. |
| 3,716,745 A | | 2/1973 | Phillips |
| 3,900,823 A | | 8/1975 | Sokal et al. |
| 4,134,114 A | | 1/1979 | Riggs et al. |
| 4,197,540 A | | 4/1980 | Riggs et al. |
| 4,233,539 A | | 11/1980 | Falce |
| 4,600,892 A | | 7/1986 | Wagner et al. |
| 5,438,686 A | | 8/1995 | Gehri et al. |
| 5,500,621 A | * | 3/1996 | Katz et al. ............... 330/43 |
| 5,608,331 A | | 3/1997 | Newberg et al. |
| 5,796,211 A | | 8/1998 | Graebner et al. |
| 5,838,195 A | * | 11/1998 | Szmurlo et al. ............ 330/149 |
| 5,940,025 A | * | 8/1999 | Koehnke et al. ............ 342/159 |
| 6,024,618 A | | 2/2000 | Makishima et al. |
| 6,177,836 B1 | * | 1/2001 | Young et al. ............... 330/43 |
| 6,285,254 B1 | | 9/2001 | Chen et al. |

OTHER PUBLICATIONS

Muhonen et al., "Amplifier Linearization for the Local Multipoint Distribution System Application," *IEEE Personal, Mobile, Indoor and Radio Communication Conference*, Boston, MA, Sep. 1998.

* cited by examiner

*Primary Examiner*—Robert Pascal
*Assistant Examiner*—Henry Choe
(74) *Attorney, Agent, or Firm*—Kirkpatrick & Lockhart LLP

(57) ABSTRACT

An amplifier system. The amplifier system includes a vacuum tube amplifier, an electron source voltage modulation circuit, and a linearization circuit. The vacuum tube amplifier includes an input signal terminal and an output signal terminal. The electron source voltage modulation circuit includes an input terminal coupled to one of the input signal terminal and the output signal of the vacuum tube amplifier, and includes an output terminal coupled to one of an electron source of the vacuum tube amplifier and an interaction region of the vacuum tube amplifier. The linearization circuit is coupled to the input signal terminal of the vacuum tube amplifier. In conjunction with or instead of the electron source voltage modulation circuit, the amplifier circuit may additionally include an electron beam control circuit, including an input terminal coupled to one of the input signal terminal and the output signal of the vacuum tube amplifier, and including an output terminal coupled to the electron source of the vacuum tube amplifier.

26 Claims, 26 Drawing Sheets

SYSTEM AND METHOD FOR LINEARIZING VACUUM ELECTRONIC AMPLIFICATION

CROSS-REFERENCE TO RELATTED APPLICATIONS

Not Applicable.

STATEMENT REGARDING FEDERALLY SPONSORED RESEARCH AND DEVELOPMENT

Not Applicable.

BACKGROUND OF INVENTION

1. Field of Invention

The present invention relates generally to vacuum electronics and, more particularly, to circuits and methods for linearizing vacuum electronic amplification.

2. Description of the Background

Amplifiers come in many forms and are used in many applications. For example, amplifiers may be used with digital or analog signals, may be used in communications systems such as wireless telecommunications and satellite communications systems, and may be semiconductor-based or vacuum tube-based.

The performance demanded of amplifiers continues to increase, and many conventional amplifiers are failing to keep pace. For example, conventional semiconductor microwave amplifiers lack the power capabilities required by many modem microwave systems. As a result, vacuum tube power amplifiers are essential components of many modern microwave systems, including telecommunications, radar, electronic warfare, and navigation systems, because microwave tube amplifiers can provide microwave energy at levels of power higher by orders of magnitude in comparison to semiconductor microwave amplifiers. The higher power levels offered by tube devices are facilitated by the fact that electrons can travel at a much higher velocity in a vacuum than in a semiconductor. The higher velocity permits use of larger structures with the same transit time. Larger structures, in turn, permit greater power levels.

The power amplification for modern high power vacuum electronic microwave amplifiers (VEMAs), however, is typically non-linear. For instance, phase non-linearity may be caused when the electrons slow down while moving through an interactive region of the tube. That slowing is a result of the electrons losing kinetic energy as they amplify a signal passing through the tube. At high power levels, however, the electrons start to slow down significantly and desynchronize from the RF field in the interactive region, thereby causing a phase lag between the input and output signals. For example, without phase compensation, the phase delay of the output signal for a traveling wave tube (TWT) VEMA operating at its saturation point may be as great as 70°–80°, which may be unacceptable for many applications, such as digital communications. Moreover, at high power levels, the beam current is not large enough to continue amplifying the input signal, causing an RF saturation or an amplitude non-linearity. Thus, non-linearity in power amplification generates higher-order intermodulation products, which may result in undesirable spectral regrowth in adjacent channels, and phase distortions, which in turn may increase bit errors in digital communications systems. The drawbacks are especially acute in digital wireless communications systems where multiple communication signals are typically multiplexed onto a single, narrow wavelength-band channel due to the limited RF spectrum bandwidth. Accordingly, practical communication limitations as well as government standards require minimal higher-order intermodulation and phase distortion. For instance, for PCS cellular telephony networks, the higher order intermodulation signals have to be 60 dB below the carrier signal.

One technique to minimize power amplification non-linearity is to operate a VEMA only in its linear range, which typically is a small fraction of its power capacity. For example, for an application that requires 50 Watts of amplification power, a tube capable of 500 Watts of amplification power may be required to produce an adequate linear range. This technique is inefficient and expensive.

Accordingly, there exists a need for an efficient and inexpensive technique for improving the linearity of high power vacuum electronic microwave amplifiers.

BRIEF SUMMARY OF INVENTION

The present invention is directed to an amplifier system. According to one embodiment, the amplifier system includes a vacuum tube amplifier, an electron source voltage modulation circuit, and a linearization circuit. The vacuum tube amplifier includes an input signal terminal and an output signal terminal. The electron source voltage modulation circuit includes an input terminal coupled to one of the input signal terminal and the output signal of the vacuum tube amplifier, and includes an output terminal coupled to one of an electron source of the vacuum tube amplifier and an interaction region of the vacuum tube amplifier. The linearization circuit is coupled to the input signal terminal of the vacuum tube amplifier.

According to another embodiment, the present invention is directed to an amplifier system, including a vacuum tube amplifier, an electron beam control circuit, and a linearization circuit. The vacuum tube amplifier includes an input signal terminal, an output signal terminal, and an electron source. The electron beam control circuit includes an input terminal coupled to one of the input signal terminal and the output signal of the vacuum tube amplifier, and includes an output terminal coupled to the electron source of the vacuum tube amplifier. The linearization circuit is coupled to the input signal terminal of the vacuum tube amplifier.

According to yet another embodiment, the present invention is directed to an amplifier system, including a vacuum tube amplifier, an electron source voltage modulation circuit, an electron beam control circuit, and a linearization circuit. The vacuum tube amplifier includes an input signal terminal and an output signal terminal. The electron source voltage modulation circuit includes an input terminal coupled to one of the input signal terminal and the output signal of the vacuum tube amplifier, and includes an output terminal coupled to one of an electron source of the vacuum tube amplifier and an interactive region of the vacuum tube amplifier. The electron beam control circuit includes an input terminal coupled to one of the input signal terminal and the output signal of the vacuum tube amplifier, and includes an output terminal coupled to the electron source of the vacuum tube amplifier. The linearization circuit is coupled to the input signal terminal of the vacuum tube amplifier.

In contrast to prior techniques, the present invention provides an efficient and inexpensive technique for linearizing the power amplification of vacuum tube amplifiers. The present invention provides an advantage over the prior techniques because, according to one embodiment, it provides for the dynamic compensation of the deleterious effects caused by non-linear power amplification of a vacuum tube amplifier based on the power, or envelope, of the input signal to the amplifier, thereby permitting the use of less expensive and more efficient components. Moreover, when combined with the linearization circuit, the present invention permits the suppression of nonlinear intermodulation signals generated by the vacuum tube amplifier by 60 dB or more below the carrier signal. These and other benefits of the present invention will be apparent from the detailed description of the invention hereinbelow.

DESCRIPTION OF THE FIGURES

For the present invention to be clearly understood and readily practiced, the present invention will be described in conjunction with the following figures, wherein.

DETAILED DESCRIPTION OF THE INVENTION

It is to be understood that the figures and descriptions of the present invention have been simplified to illustrate elements that are relevant for a clear understanding of the present invention, while eliminating, for purposes of clarity, other elements of a conventional vacuum tube device. Those of ordinary skill in the art will recognize that those and other elements may be desirable. However, because such elements are well known in the art, and because they do not facilitate a better understanding of the present invention, a discussion of such elements is not provided herein.

Figure 1:
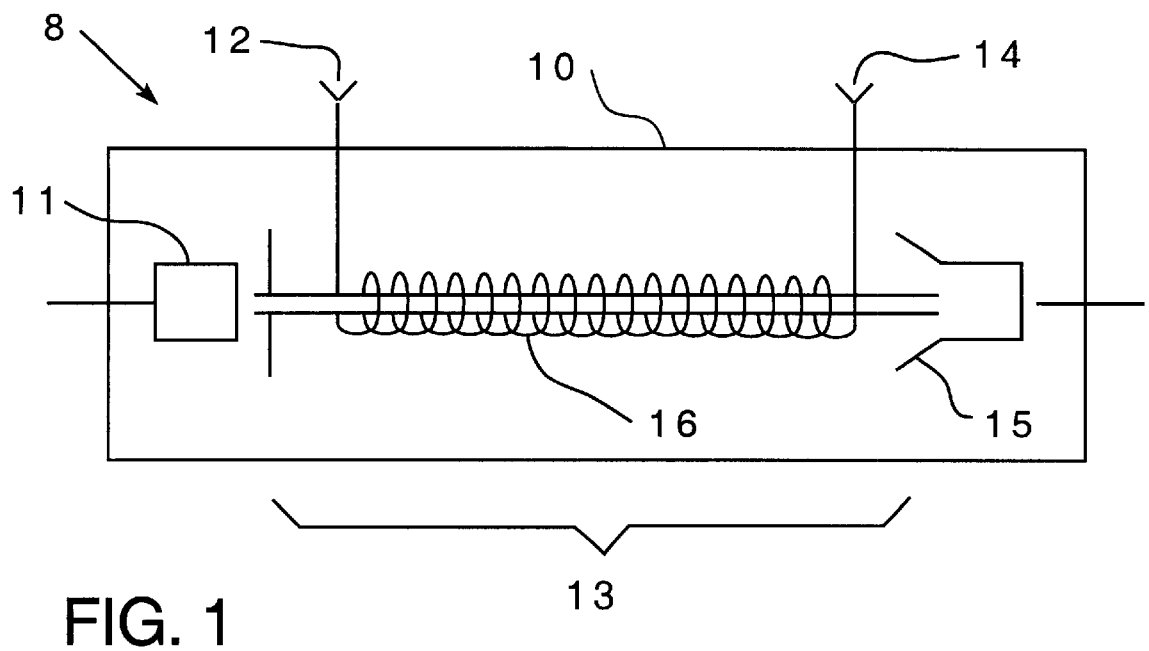
FIG. 1 is a schematic diagram of one type of vacuum tube device.

FIG. 1 is a schematic diagram of one type of a vacuum tube device 8 including an evacuated tube 10, a source of electrons 11, an input signal terminal 12 for introducing an input signal, an interaction region 13 where electrons interact with the input signal, and an output signal terminal 14 where an amplified signal emerges from the tube 8. The vacuum tube device 8 may be, for example, a traveling wave tube (TWT), as illustrated in FIG. 1. A TWT typically includes a focusing magnet (not shown) to focus the beam of electrons through the interaction region 13, a collector 15 to collect the electron beam after the output microwave power has been generated, and an internal attenuator (not shown) to absorb microwave power reflected back into the tube from mismatches in the output. Although the present invention will be described in the context of a TWT, the benefits of the present invention may be realized with other vacuum tube devices such as, for example, klystrons and triodes.

The source of electrons 11 may be, for example, an electron gun. An electron gun is a particular kind of electron source which generates, accelerates, and focuses an electron beam so that the beam follows a desired trajectory after it leaves the electron gun. An electron gun is discussed in more detail hereinbelow with respect to FIG. 2.

The input signal terminal 12 receives an input signal to be amplified by the tube device 8, which is typically an amplitude modulated carrier signal. The carrier signal may be, for example, in the microwave frequency range. The carrier signal may be modulated by a data signal, such as a voice data signal having a frequency, for example, in the kHz range, or a video data signal having a frequency, for example, in the MHz range. Of course, the carrier signal may also be modulated by other types of data signals. In any event, the frequency of the data signal modulating the carrier signal may be significantly less than the frequency of the carrier signal.

The interactive region 13 is a portion of the tube 8 where the input signal is amplified through interaction with an electron beam. The interaction region 13 may include, for example, a conductive helix 16, as illustrated in FIG. 1, for broadband applications or a coupled-cavity region (not shown) for high power applications. In the case of a conductive helix 16, for example, the electron beam may pass through the helix 16 while the signal to be amplified is conducted on the helix 16, and inductive interactions occur between the signal and the electrons. The signal modulates the electron beam, and the modulated electron beam amplifies the signal. Typically, it is desirable for the signal to be amplified and the electrons to move along the interaction region at the same speed. If, however, there is a speed deviation between the signal and the electrons which is a function of the power of the signal, phase distortion and some amplitude distortion may occur.

The output signal terminal 14 is the pathway by which the signal leaves the tube device 8. The signal on the output signal terminal 14 is an amplified version of the input signal that entered the tube device 8 at the input signal terminal 12.

Figure 2:
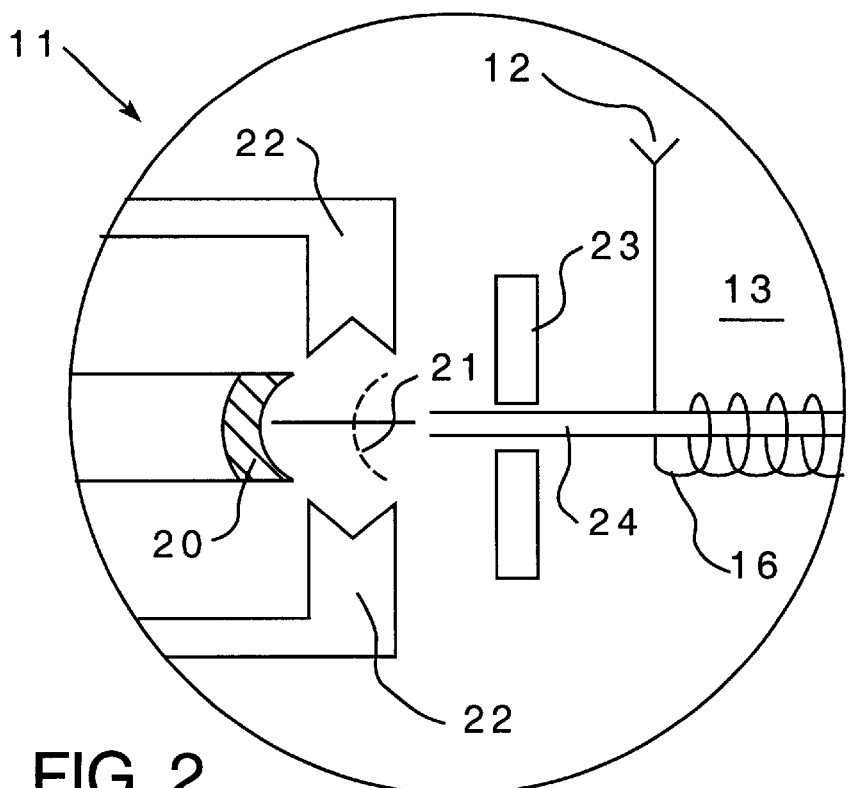
FIG. 2 is a schematic diagram of a source of electrons of the vacuum tube device of FIG. 1.

FIG. 2 is a schematic diagram of a source of electrons 11 in the form of an electron gun according to one embodiment of the present invention. In that embodiment, the source of electrons 11 includes a thermionic cathode 20, one or more grids 21 for inducing emission of electrons, focusing electrodes 22 for focusing the electrons into a beam, and an apertured anode 23 for further directing the electron beam 24 into the interaction region 13. The source of electrons 11 produces an electron beam 24. For TWT applications, a long, thin electron beam 24 at a relatively low voltage and high current density is typically desirable. Electron guns have many embodiments and variations, such as a planar cathode faced by a planar anode to more elaborate designs such as Pierce guns, conical diode electrodes, concentric cylinders, and spherical cap cathodes. According to the present invention, the electron source 11 may be, for example, any such electron gun.

The cathode 20 introduces the electrons into the tube 10. The cathode 20 is typically at a lower voltage relative to the grid(s) 21, the anode 23, and the helix 16. This may be realized, for example, by applying a negative voltage to the cathode 20 such as, for example, −10 kV, and grounding the anode 23 and the helix 16. The voltage potential difference between the cathode 20 and the grid(s) 21 typically is on the order of 100 V.

The voltage potential difference between the cathode 20 and the anode 23 affects the kinetic energy of the electrons emitted by the cathode 20: the greater the voltage potential difference the greater the kinetic energy of the emitted electrons, and the lesser the voltage potential the lesser the kinetic energy of the electrons. The kinetic energy of the emitted electrons may also be increased by providing a voltage potential difference between the cathode 20 and the interaction region 13 of the tube device 8, such as by modulating the voltage potential difference between the cathode 20 and the helix 16 according to, for example, the serrodyning technique. The number of electrons emitted by the cathode 20, which is proportional to the current of the electron beam 24, is related to the voltage potential difference between the cathode 20 and, for example, the focusing electrodes 22 or the grid(s) 21.

Figure 3:
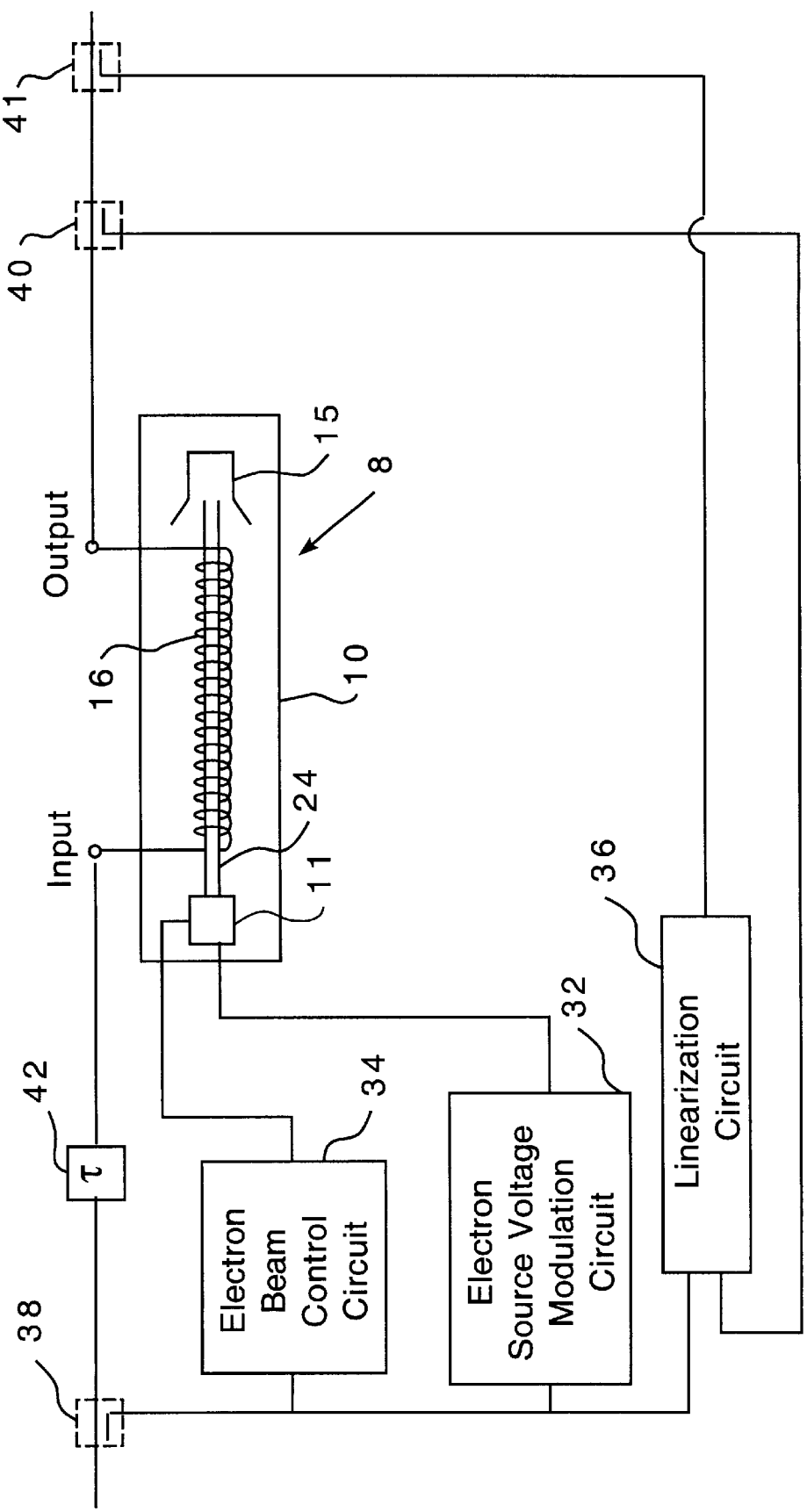
FIG. 3 is a combination schematic/block diagram of an amplifier system according to one embodiment of the present invention.

FIG. 3 is a block diagram of an amplifier system 30 according to one embodiment of the present invention. The amplifier system 30 includes the vacuum tube device 8, such as described hereinbefore with respect to FIGS. 1 and 2, an electron source voltage modulation circuit 32, an electron beam control circuit 34, and a linearization circuit 36. As illustrated in FIG. 3, each of the electron source voltage modulation circuit 32 and the electron beam control circuit 34 may be coupled to the input of the tube device 8 by, for example, a directional coupler 38. According to other embodiments, as discussed further hereinbelow, either of the electron source voltage modulation circuit 32 and the electron beam control circuit 34 may be coupled to the output of the tube device 8, or coupled to both the input and the output.

The linearization circuit 36 may be also have an input terminal coupled to the input of the tube device 8, as well as an input terminal coupled to the output terminal of the tube device 8 by a directional coupler 40. In addition, the linearization circuit 36 may include an output terminal coupled to the output of the tube device 8 by a directional coupler 41. According to such an embodiment, the linearization circuit 36 may operate according to a feedforward technique by canceling the distortion components generated by the tube device 8 when amplifying the input signal at either the output of the tube device. According to other embodiments, as discussed hereinbelow, the linearization circuit 36 may provide additional linearization compensation according to, for example, a feedback technique, a feedforward/feedback technique, or a predistortion technique.

Also as illustrated in FIG. 3, the amplifier system 30 may include a delay line 42 between the input terminal 12 of the tube device 8 and the point where the input signal is coupled to the electron source voltage modulation circuit 32 and the electron beam control circuit 34. The purpose of the delay line 42 may be to delay the input signal to compensate for a time delay caused by the circuits 32, 34.

The electron source voltage modulation circuit 32 provides compensation for the phase distortion caused by the non-linear characteristics of the tube device 8. The electron source voltage modulation circuit 32 is coupled to the electron source 11 of the tube device 8, and modulates the relative voltages in the electron source 11, such as the voltage of the cathode 20 relative to the anode 23, based on the power level (or envelope) of the input signal to the tube device 8. In that way, the electron source voltage modulation circuit 32 may adjust the kinetic energy, and hence the velocity, of the electrons emitted by the electron source 11, thereby reducing the amount of phase delay between the input signal and the output signal resulting from the non-linearity of the tube device 8. Different embodiments for the electron source voltage modulation circuit 32 will be described further hereinbelow with respect to FIGS. 4–10.

The electron beam control circuit 34 provides compensation for the amplitude distortion caused by the non-linearity of the tube device 8. The amplitude distortion of the tube device 8 is related to the current of the electron beam 24 generated by the electron source 11. The current of the electron beam 24 may be increased by increasing the number of electrons emitted by the electron source 11. According to one embodiment, as discussed further hereinbelow, the electron beam control circuit 34 is coupled to the electron source 11, and controls the current of the electron beam 24 emitted from the electron source by controlling the voltage applied to the focusing electrodes 22 relative to the cathode 20, thereby providing electron beam control. According to another embodiment, the electron beam control circuit 34 may control the voltage applied to the grid(s) 21 relative to the cathode 20. Embodiments of the electron beam control circuit 34 will be described further hereinbelow with respect to FIGS. 11, 11a and 11b.

Figure 4:
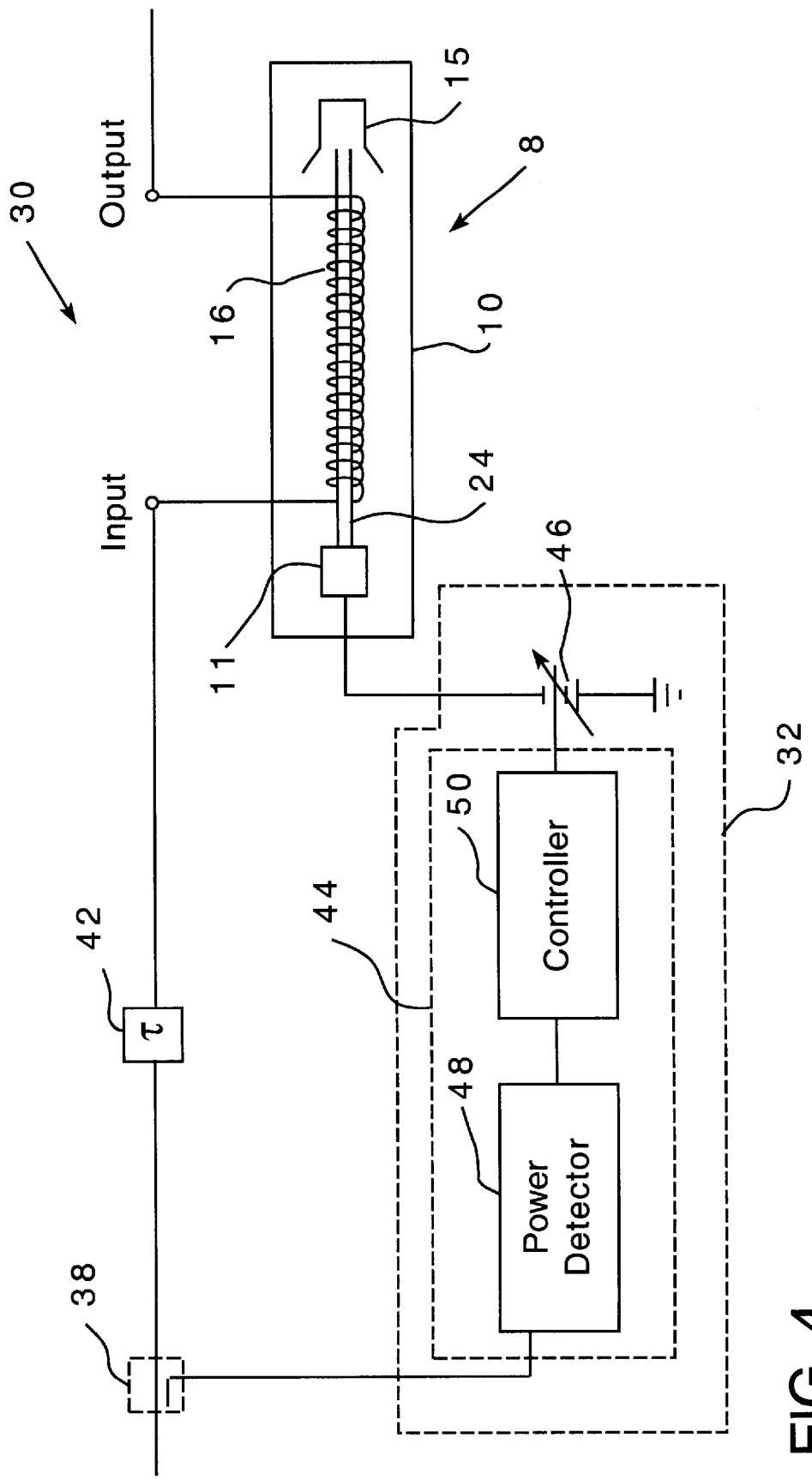
FIG. 4 is a combination schematic/block diagram of the electron source voltage modulation circuit of the amplifier system of FIG. 3 according to one embodiment of the present invention.

FIGS. 4–10 are combination schematic/block diagrams of the amplifier system 30 of the present invention showing different embodiments for the electron source voltage modulation circuit 32. For purposes of clarity, the electron beam control circuit 34 and the linearization circuit 36 are not illustrated in FIGS. 4–10. In FIG. 4, the electron source voltage modulation circuit 32 includes a control circuit 44 and a variable power source 46. The control circuit 44 includes a power detector 48 and a controller 50. The control circuit 44 modulates the relative voltages in the electron source 11, such as the voltage of the cathode 20 relative to the anode 23, based on the power level of the input signal. In that way, the control circuit 44 may adjust the kinetic energy, and hence the velocity, of the electrons emitted by the electron source 11, thereby reducing the amount of phase delay between the input signal and the output signal.

The power detector 48 is coupled to the input signal and determines the power level, or envelope, of the input signal. The power detector 48 may be, for example, a crystal power detector or any other type of power detector, such as an integrated circuit. In particular, the power detector 48 determines the power level of the carrier signal modulated by the data signal. As described hereinbefore, the frequency of the data signal is typically lower than the frequency of the carrier signal. The power detector 48 outputs a signal indicative of the detected power level. The signal may be, for example, an analog voltage signal or a digital signal.

The controller 50 receives the signal from the power detector 48 and generates a control signal that is provided to the variable power source 46 to compensate for variations in the power level of the input signal. The relationship between the output of the controller 50 and the power level of the input signal, as determined by the power detector 48, may not be linear because the phase distortion introduced by the tube device 8 is not linear with respect to the signal power.

The control signal output by the controller 50 may be a function of the non-linearity of the tube device 8 and the power detector 48, as well as the power level of the input signal. That is, the typically non-linear relationship between the output of the controller 50 and the power of the input signal, as determined by the power detector 48, may be function of the non-linear characteristics of the tube device 8 and the power detector 48. The relationship may be determined, for example, by iterative testing of a particular tube device 8. According to one embodiment, a low power RF signal may be applied to the tube device 8, and the phases of the input and output signals may be compared. For low power input signals, the phase difference may be considered a nullity. Progressively, the power of the input signal may be increased, and the phases of the input and output signals compared. At certain points in the progression, the voltage applied to the cathode 20 may be increased so that there is no phase difference between the input and output signals. Accordingly, a relationship between the power of the input signal and the cathode voltage needed to eliminate the phase lag may be determined. This relationship may be used to provide the appropriate control signal from the controller 50 to the cathode 20 to reduce phase distortion.

Figure 4A:
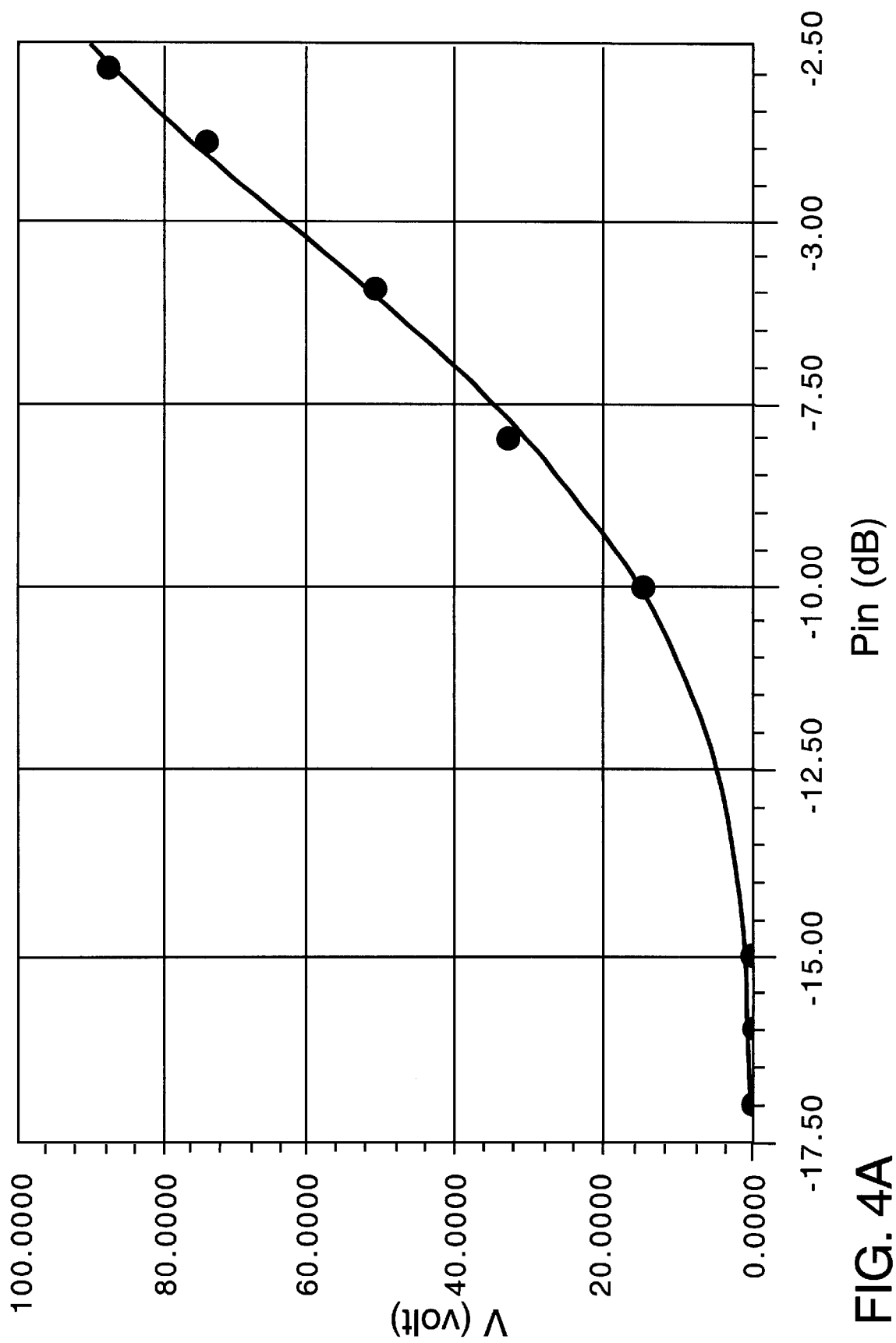
FIG. 4a is a graphical representation of an example of the relationship between the power of the input signal and the cathode correction voltage required to eliminate the phase lag between the input signal and the output signal for a Teledyne Technologies MEC5445 tube device.

FIG. 4A is a graphical representation of an example of the relationship between the power of the input signal ($P_{in}$) and the cathode correction voltage necessary to eliminate the phase lag between the input signal and the output signal. The graph of FIG. 4A is for a Teledyne Technologies MEC5445 tube device, available from Teledyne Technologies, Inc., Los Angeles, Calif. As can be seen, the relationship may be non-linear. Moreover, an equation representative of the relationship may be derived, such as:

$$V = ae^{-bP_{in}2} \tag{1}$$

where V is the cathode correction voltage in volts, $P_{in}$ is the input power in dBm, and a, b are coefficients, such as a=102.467 (volts), and b=0.0188 (dBm$^{-2}$) for the illustrated graphical representation.

The controller 50 may be either a digital device or an analog device, and the control signal output from the controller 50 may be an analog voltage signal or a digital signal. For an embodiment in which the controller 50 is a digital device, the controller 50 may be, for example, a digital signal processor (DSP) or an application specific integrated circuit (ASIC), programmed to map the output signal of the power detector 48 to the appropriate control signal to be supplied to the variable power source 46 such that the appropriate voltage is applied to the electron source 11 to minimize phase distortion. Conventional DSP technology, however, has an upper operating frequency that is inadequate for some applications. In such cases, an analog gain circuit may be implemented to control the gain of the controller. One example of such a gain circuit is described in more detail hereinbelow with respect to FIG. 5.

The variable power source 46 provides variable power to the electron source 11 based on the control signal provided by the controller 50, which is a function of the power level of the input signal.

Figure 5:
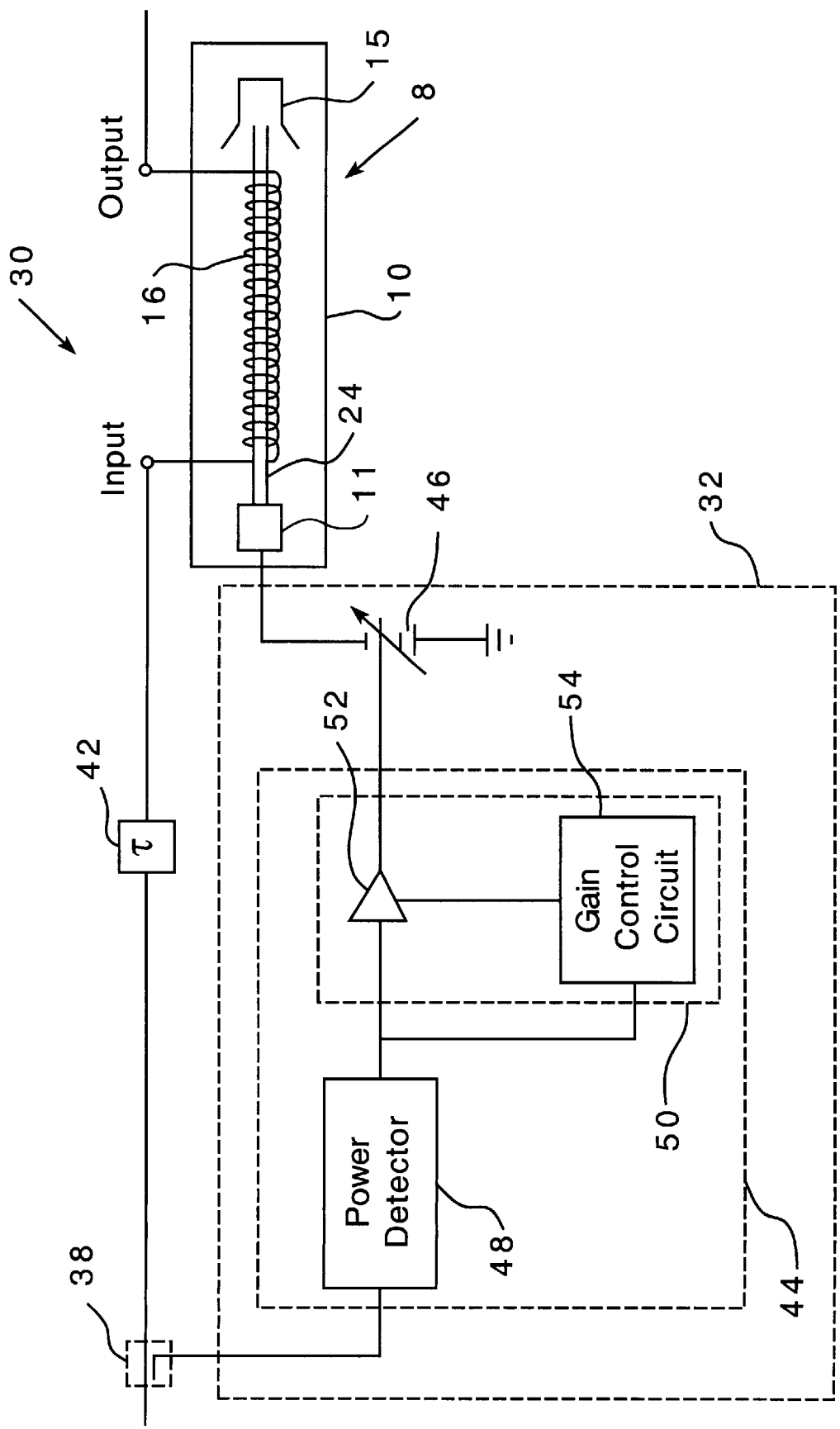
FIG. 5 is a combination schematic/block diagram of the electron source voltage modulation circuit of the amplifier system of FIG. 3 according to another embodiment of the present invention.

FIG. 5 is a combination schematic/block diagram of the amplifier system 30 according to one embodiment of the present invention in which the controller 50 is an analog device. According to such an embodiment, the controller 50 may include an analog amplifier 52 and a gain control circuit 54. The analog amplifier 52 may be, for example, a liner amplifier or a non-linear amplifier. The gain control circuit 54 may have an input terminal connected to the output terminal of the power detector 48 and an output terminal connected to a gain control terminal of the analog amplifier 52. The gain control circuit 54 may be, for example, a function generator tuned to the power amplification characteristics of the tube device 8 and the non-linearity characteristics of the power detector 48. As such, the gain control circuit 54 may control the gain level of the analog amplifier 52 based on the characteristics of the power detector 48 and the tube device 8 such that the appropriate voltage signal is applied to the electron source 11 via the variable power source 46 to minimize phase delay caused by the non-linearity of the tube device 8.

Figure 6:
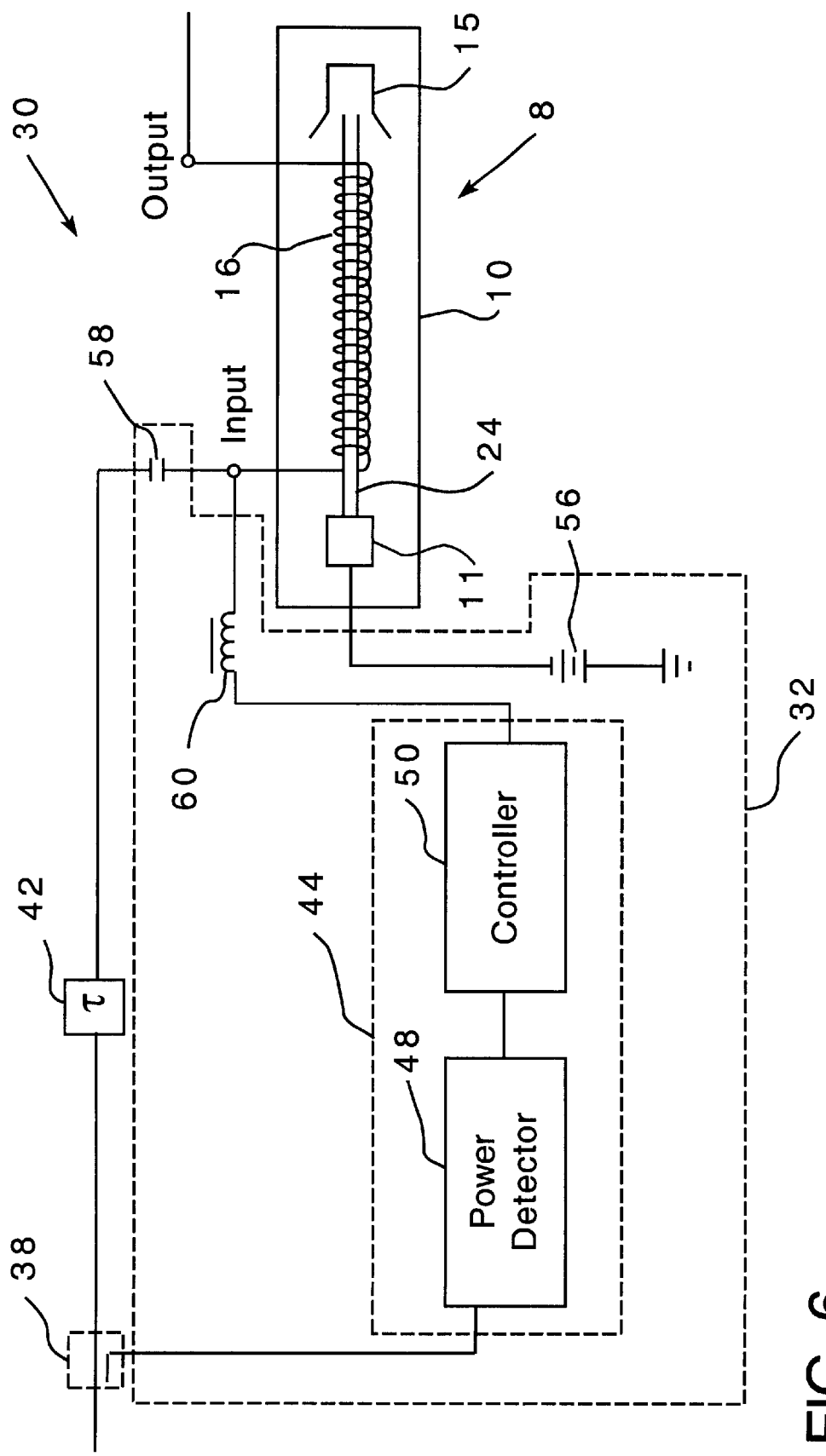
FIG. 6 is a combination schematic/block diagram of the electron source voltage modulation circuit of the amplifier system of FIG. 3 according to another embodiment of the present invention.

FIG. 6 is a combination schematic/block diagram of the amplifier system 30 according to another embodiment of the present invention. That embodiment includes a non-variable power source 56 connected to the electron source 11 of the tube device 8. In addition, the input signal is coupled to the helix 16 of the tube device 8 via a blocking capacitor 58, and the output signal of the controller 50 is coupled to the helix 16 via a choke 60 according to, for example, a serrodyne modulation technique.

According to the illustrated embodiment, the control signal output from the controller 50 may be a low frequency voltage signal, which is applied to the helix 16, such that the voltage signal applied to the helix 16 causes the electrons emitted by the electron source 11 to accelerate at an increased rate to compensate for the phase delay caused by the non-linearity of the tube device 8. Thus, the voltage of the helix 16 may be modulated relative to the voltage of the cathode 20 according to the serrodyne modulation technique.

The capacitor 58 isolates the low frequency control signal output from the control circuit 44 from the high frequency input signal, and the choke 60 isolates the control circuit 44 from the high frequency input signal. In addition, the choke 60 may isolate the tube device 8 from spurious high frequency signals generated by the control circuit 44. Consequently, the amplifier system 30 illustrated in FIG. 6 operates to minimize the phase delay caused by the non-linearity of the tube device 8 in a fashion similar to the amplifier system 30 illustrated in FIG. 4, except that instead of applying an increased negative voltage to the cathode 20 relative to the anode 23 to enhance the acceleration of the electrons emitted by the electron source 11, an increased positive voltage is applied to the helix 16 relative to the cathode 20.

Figure 7:
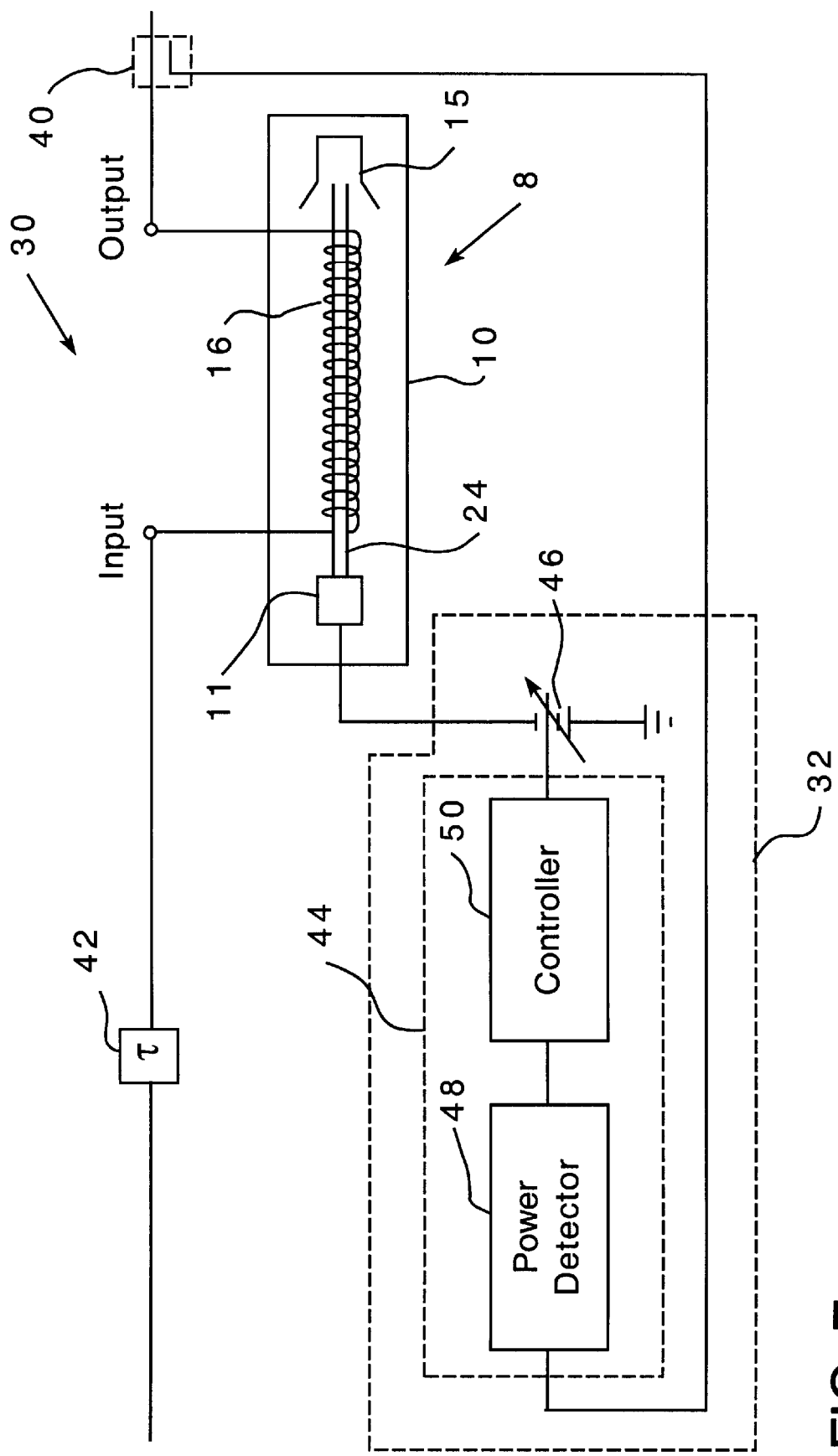
FIG. 7 is a combination schematic/block diagram of the electron source voltage modulation circuit of the amplifier system of FIG. 3 according to another embodiment of the present invention.

FIG. 7 is a combination schematic/block diagram of the amplifier system 30 according to another embodiment of the present invention. The amplifier system 30 illustrated in FIG. 7 is similar to that of FIG. 4, except that the input terminal of the power detector 48 is coupled to the output signal of the tube device 8 rather than the input signal. According to such an embodiment, the power detector 48 may output a signal proportional to the envelope of the output signal. The controller 50 may then output the appropriate control signal based on the output signal from the power detector 48, and the control signal may be applied to the electron source 11 of the tube device 8 to compensate for the phase delay caused by the non-linearity of the tube device 8, as described hereinbefore with respect to FIG. 4.

Figure 8:
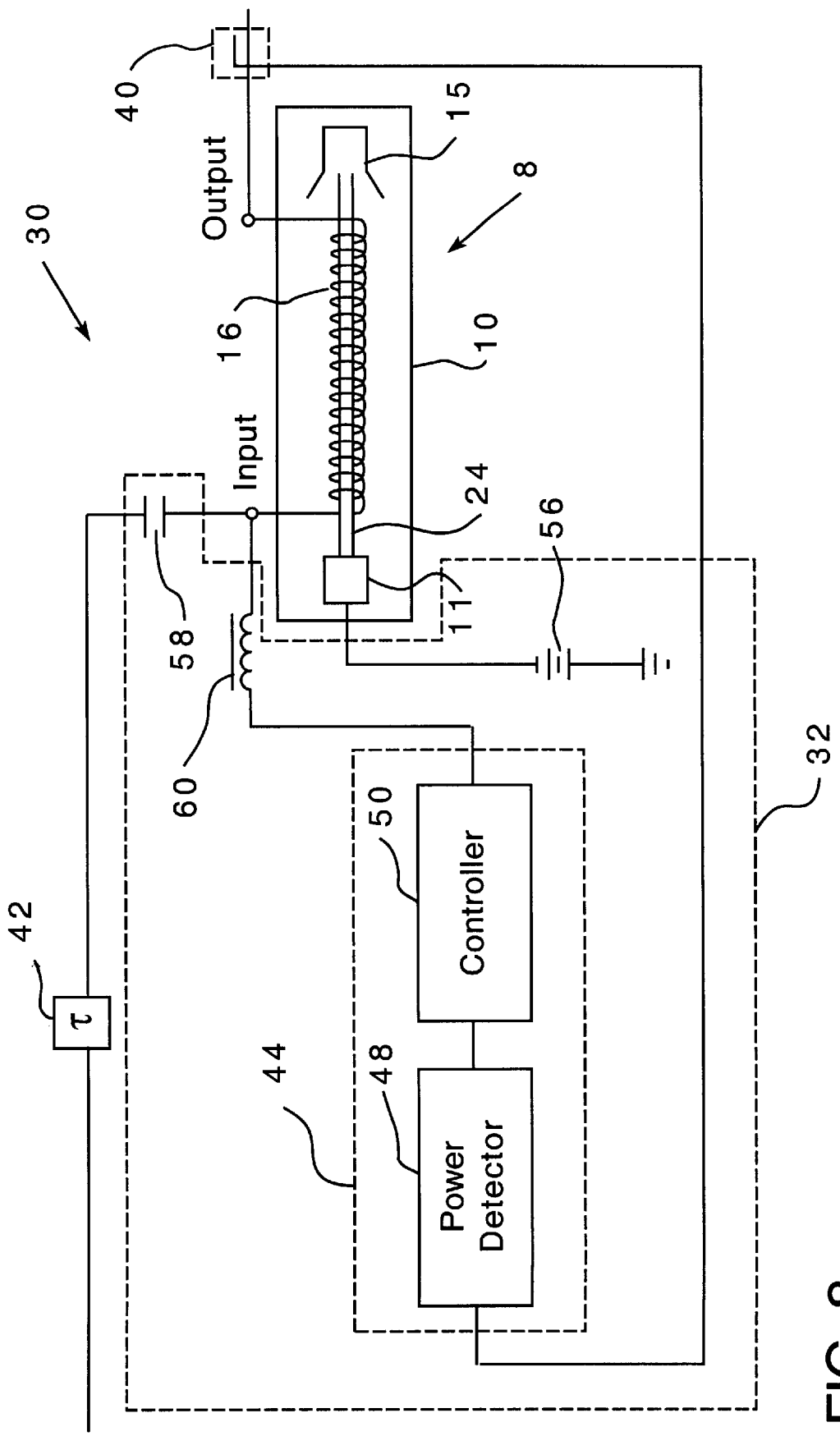
FIG. 8 is a combination schematic/block diagram of the electron source voltage modulation circuit of the amplifier system of FIG. 3 according to another embodiment of the present invention.

FIG. 8 is a combination schematic/block diagram of the amplifier system 30 according to another embodiment of the present invention in which the control circuit 44 is coupled to the output signal of the tube device 8. The amplifier system 30 illustrated in FIG. 8 is similar to that illustrated in FIG. 7, except that the output of the controller 50 is coupled to the helix 16 to increase the acceleration of the electron emitted from the electron source 11, as described hereinbefore with regard to FIG. 6.

Figure 9:
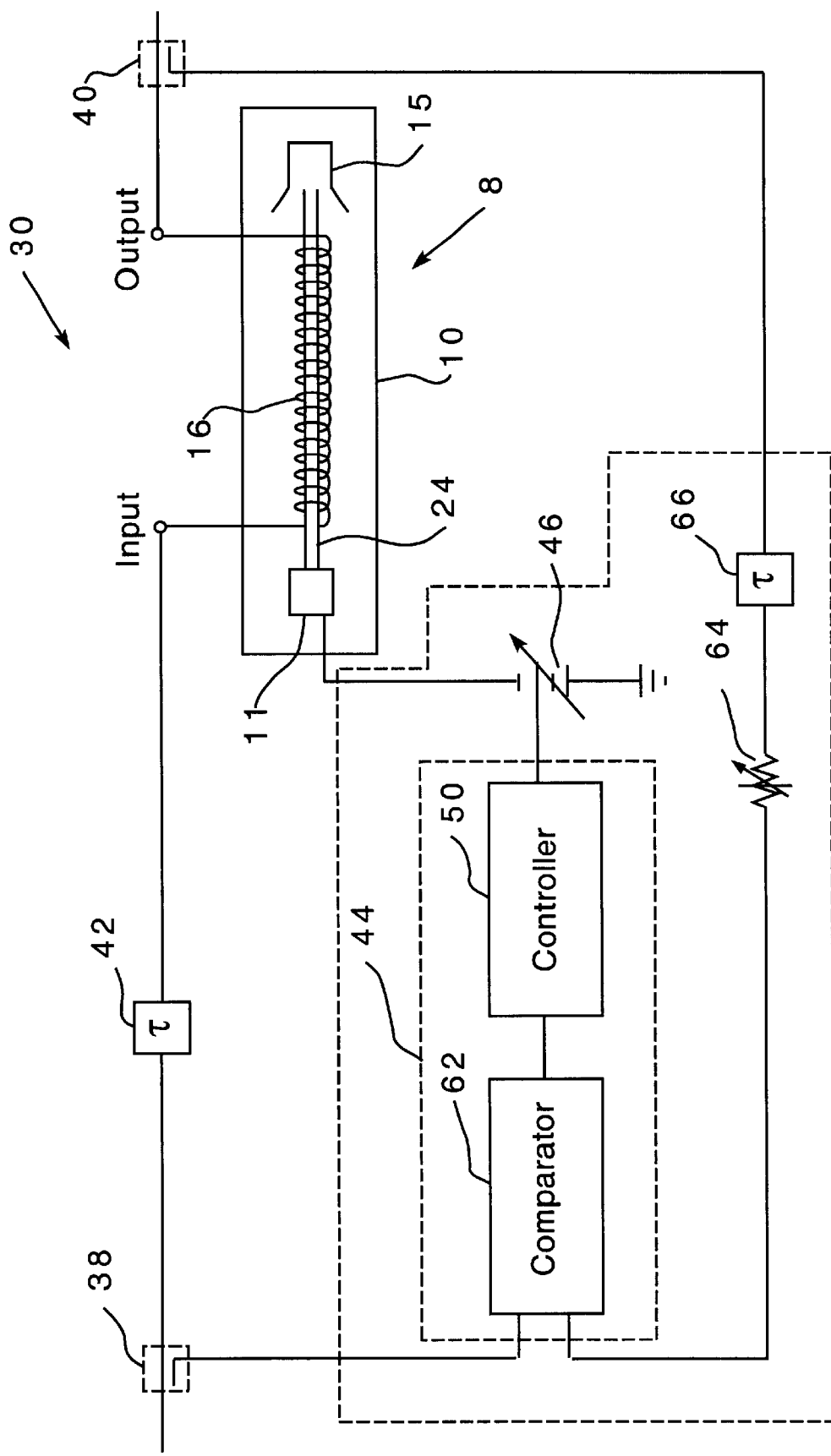
FIG. 9 is a combination schematic/block diagram of the electron source voltage modulation circuit of the amplifier system of FIG. 3 according to another embodiment of the present invention.

FIG. 9 is a combination schematic/block diagram of the amplifier system 30 according to another embodiment of the present invention in which a phase-lock loop is used to compensate for the phase delay caused by the non-linearity of the tube device 8. The control circuit 44 for the illustrated embodiment includes a comparator 62 having a first input terminal coupled to the input signal of the tube device 8 and a second input terminal coupled to the output signal of the tube device 8. An attenuator 64 and a delay circuit 66 may be coupled between the output signal and the comparator 62 to harmonize the power and time delay of the input and output signals to be compared by the comparator 62.

The comparator 62 may compare the phases of the input signal and the output signal of the tube device 8, and output a signal to the controller 50 proportional to the phase difference. The phase comparator 62 may be, for example, a phase detector embodied as a hybrid circuit including, for example, a fast step recovery diode, two coupling capacitors and a matched Schottky diode pair.

The controller 50 may generate the appropriate control signal based on the output signal from the comparator 62. The control signal is then applied to the electron source 11 of the tube device 8 via the variable power source 46, as described hereinbefore with regard to FIG. 4, to modulate the electron beam 24 emitted by the electron source 11 to compensate for the phase delay generated by the non-linearity of the tube device 8.

The comparator 62 may be, for example, a digital device or an analog device. For an embodiment in which the comparator 62 is an analog device, a power detector (not shown) may be coupled between the comparator 62 and the controller 50 to cancel the carrier frequency of the input and output signals.

Figure 9A:
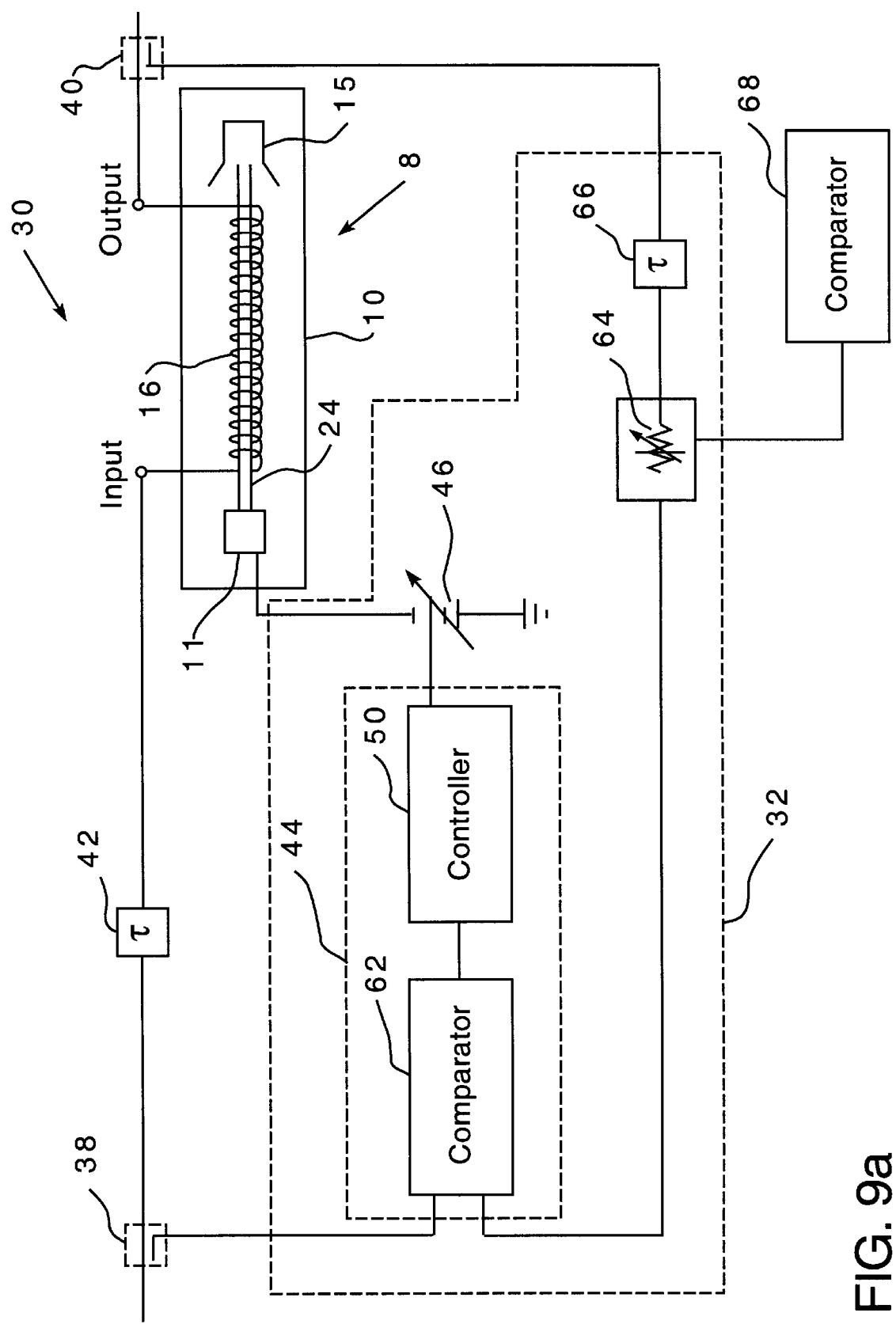
FIG. 9a is a combination schematic/block diagram of the electron source voltage modulation circuit of the amplifier system of FIG. 3 according to another embodiment of the present invention.

FIG. 9a is a combination schematic/block diagram of the amplifier system 30 according to another embodiment. According to the illustrated embodiment, the attenuation provided by the attenuator 64 may be adaptively varied to correspond to the gain provided by the tube device 8 so that the input and output signals compared by the comparator 62 are substantially the same signal strength. According to such an embodiment, the attenuation provided by the attenuator 64 and the coupler 40 should match the gain of the tube device 8. The input and output signals of the tube device 8 may be sampled be a comparator 68 to determine the gain of the tube device 8. The comparator 68 may output a signal to the attenuator 64 to adaptively adjust the attenuation provided by the attenuator 64 to compensate for any variance in the gain provided by the tube device 8.

Figure 9B:
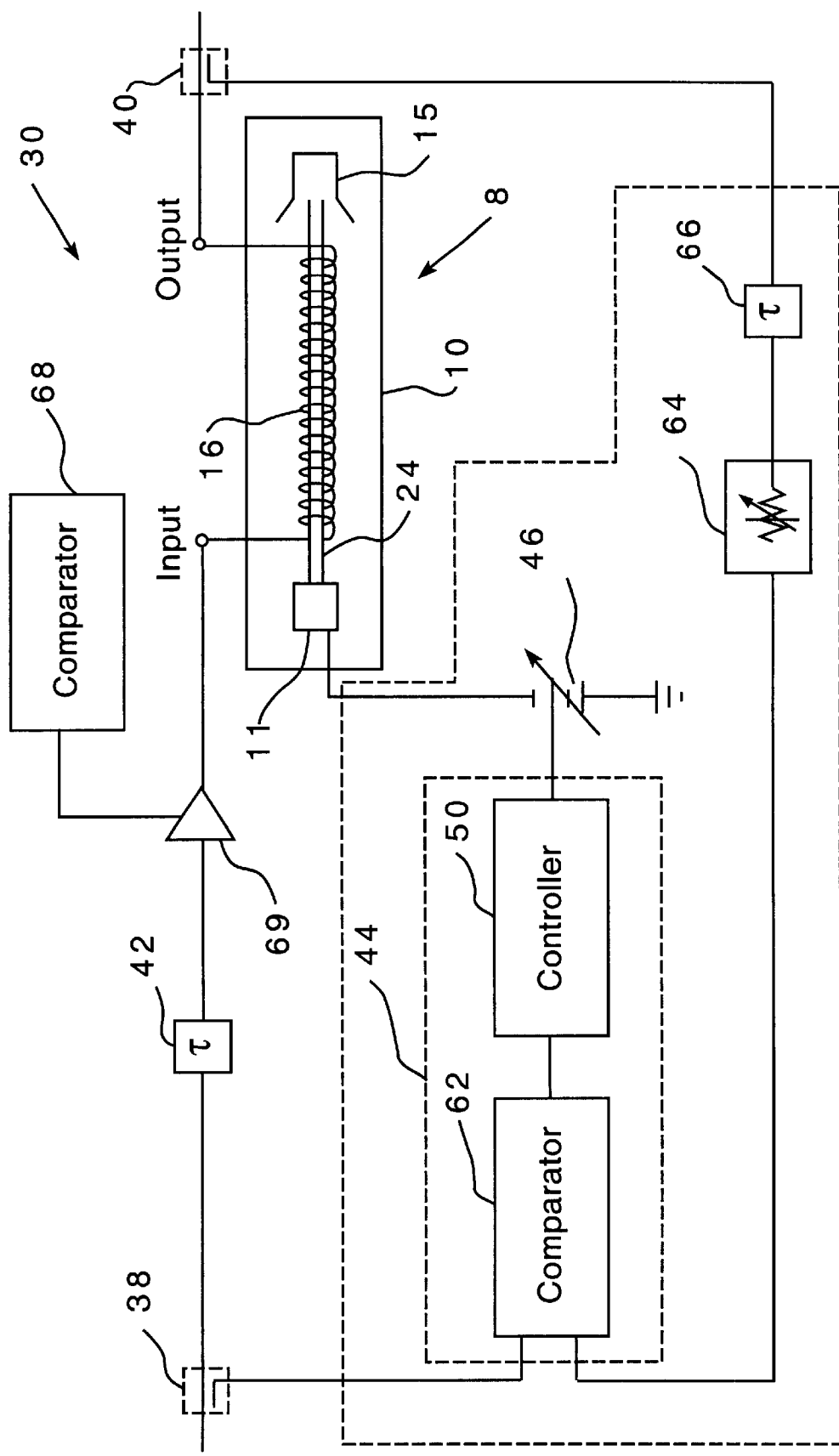
FIG. 9b is a combination schematic/block diagram of the electron source voltage modulation circuit of the amplifier system of FIG. 3 according to another embodiment of the present invention.

According to another embodiment, illustrated in FIG. 9b, the attenuator 64 is a fixed attenuator, and a pre-amplifier 69 is provided at the input of the tube device 8. The gain provided by the pre-amplifier 69 may be adjusted so that the attenuation provided by the attenuator 64 and the coupler 40 match the gain provided by the tube device 8 and the pre-amplifier 69. According to such an embodiment, the input and output signals of the tube device 8 may be sampled by the comparator 68 to determine the gain of the tube device 8. The comparator 68 may output a signal to the pre-amplifier 69 to adaptively adjust the gain provided by the pre-amplifier 69 to compensate for any variance in the gain provided by the tube device 8. The pre-amplifier 69 may be, for example, a solid-state amplifier. Accordingly, where, for example, the gain provided by the tube device drops by 2 dB, the gain of the pre-amplifier 69 may be adjusted to provided 2 dB of gain such that the input and output signal compared by the comparator 62 are of substantially the same signal strength.

Figure 10:
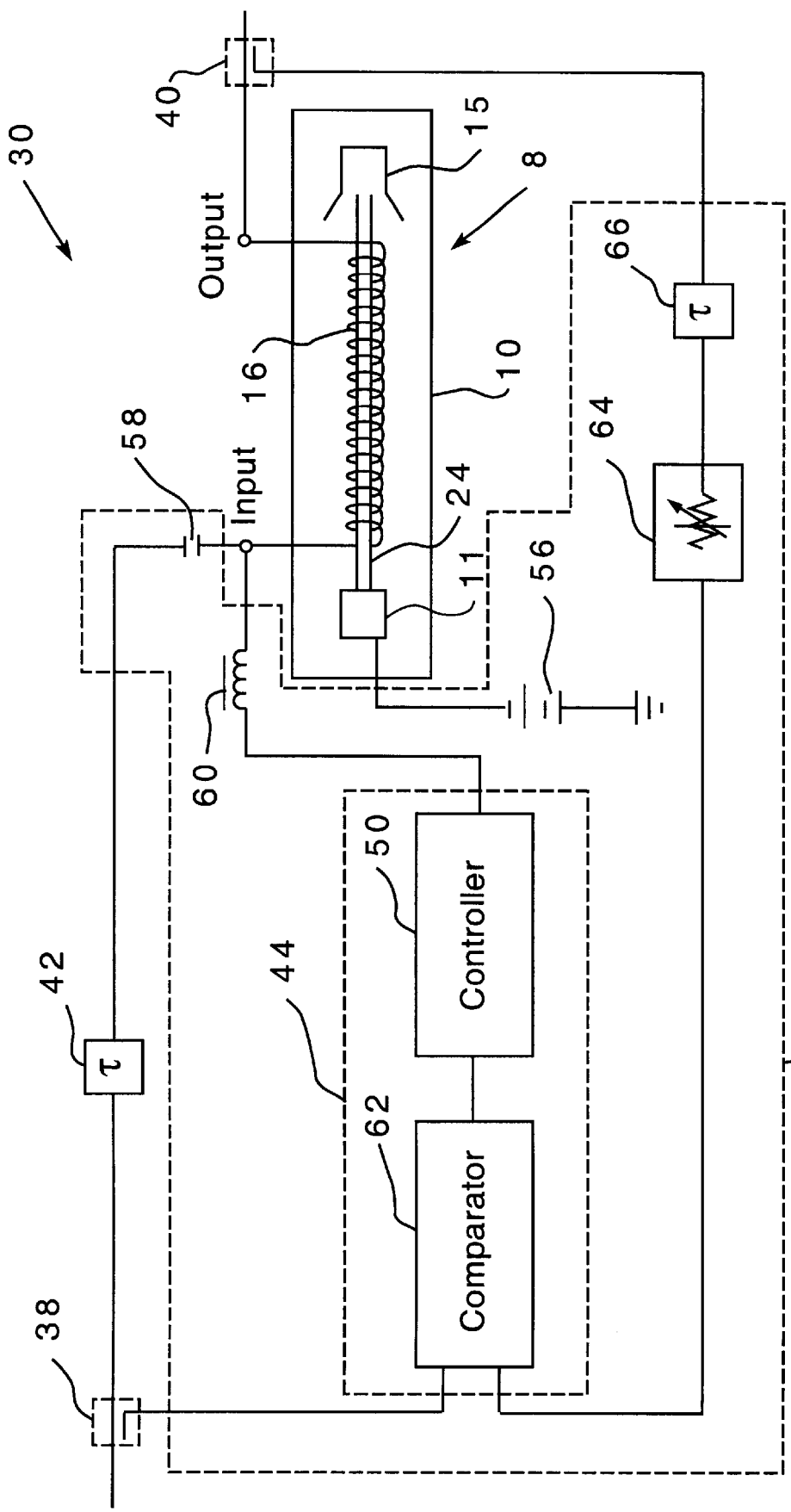
FIG. 10 is a combination schematic/block diagram of the electron source voltage modulation circuit of the amplifier system of FIG. 3 according to another embodiment of the present invention.

FIG. 10 is a combination schematic/block diagram of the amplifier system 30 according to another embodiment of the present invention. The amplifier system 30 illustrated in FIG. 10 is similar to that illustrated in FIG. 9, except that the output of the controller 50 is coupled to the helix 16 of the tube device 8. According to such an embodiment, the control signal output by the controller 50 may be a voltage signal supplied to the helix 16 to accelerate electrons from the electron source 11, as described hereinbefore with respect to FIG. 6.

Figure 11:
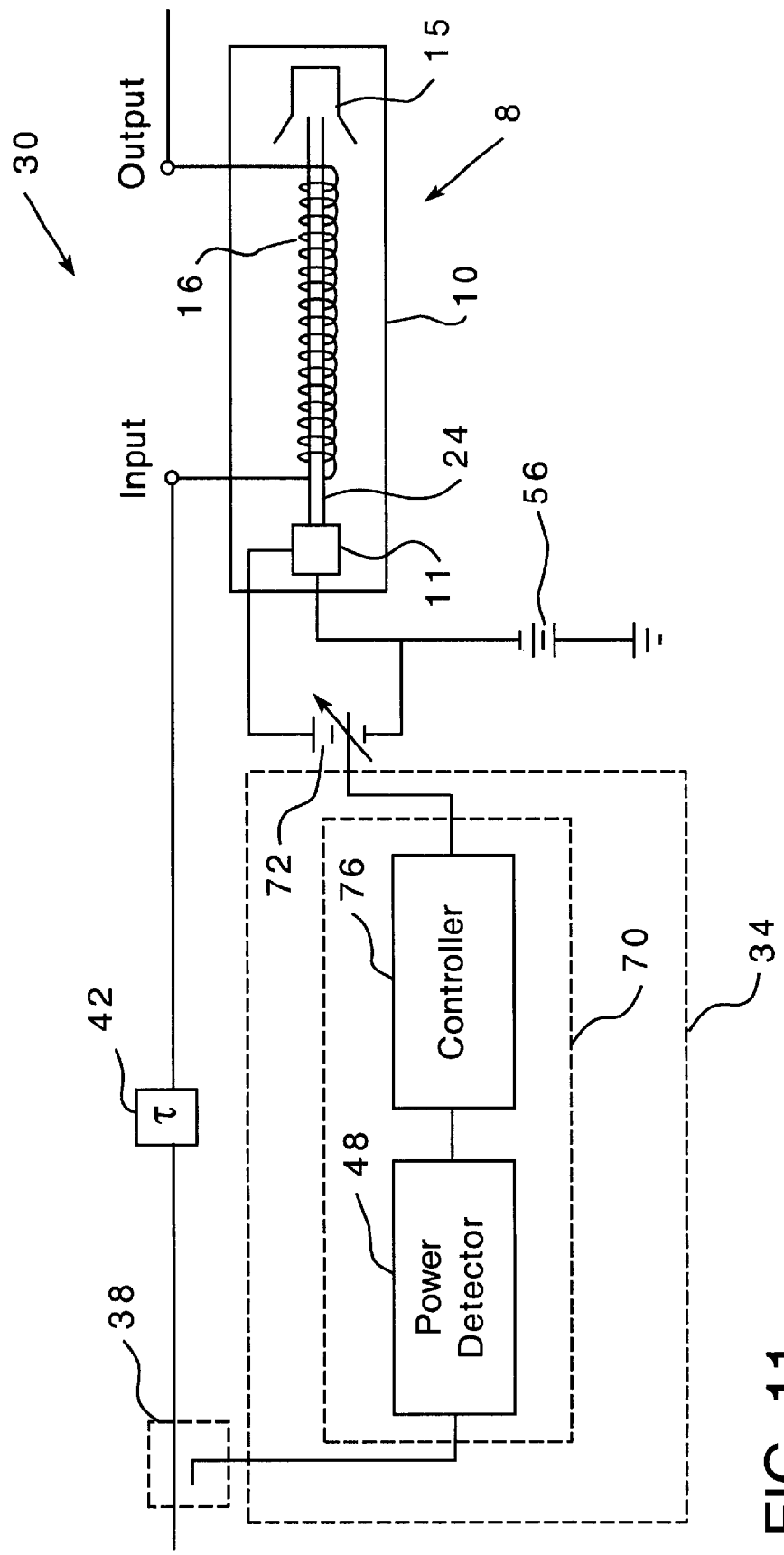
FIG. 11 is a combination schematic/block diagram of the electron beam control circuit of the amplifier system of FIG. 3 according to one embodiment of the present invention.
Figure 11A:
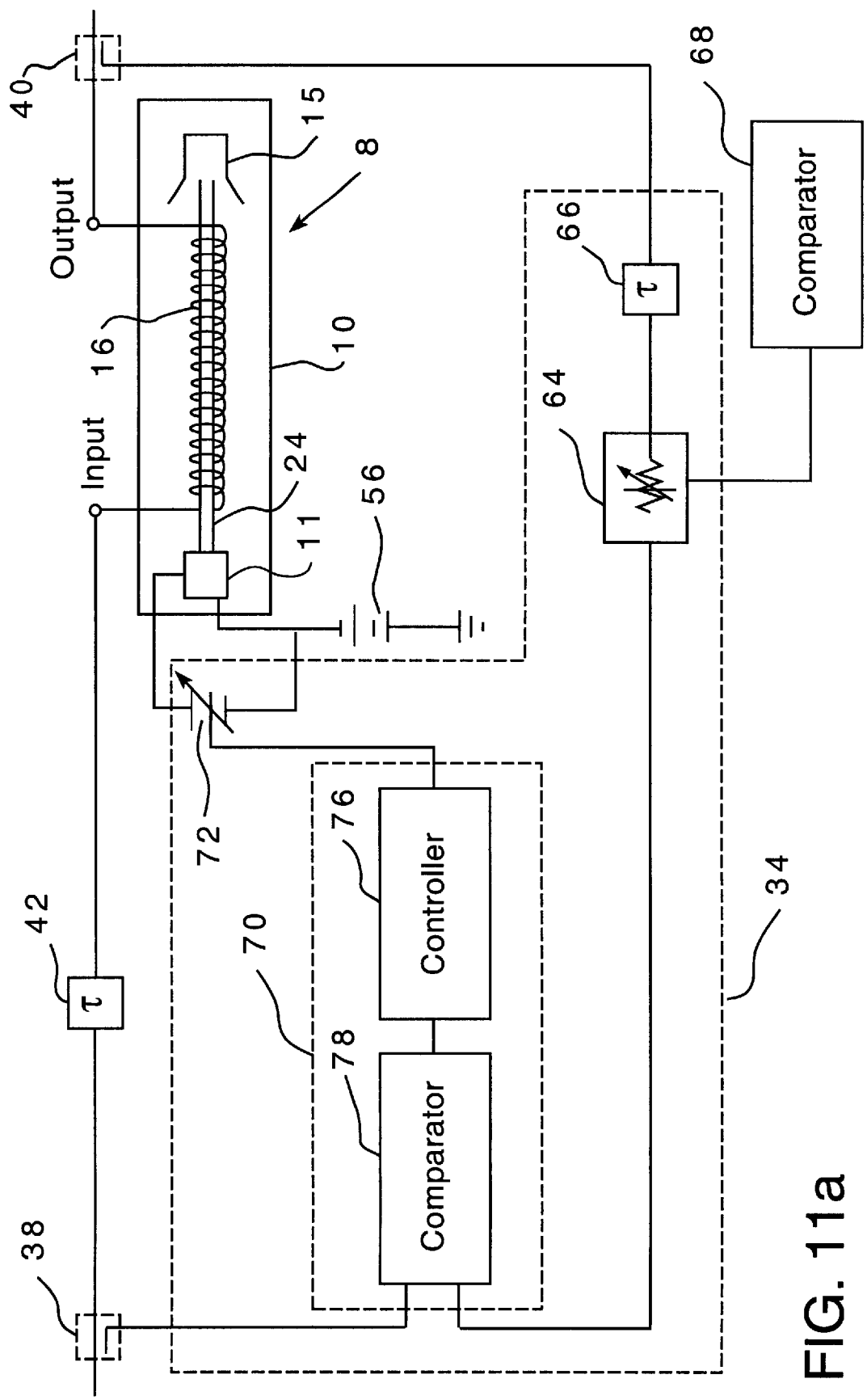
FIG. 11a is a combination schematic/block diagram of the electron beam control circuit of the amplifier system of FIG. 3 according to one embodiment of the present invention.
Figure 11B:
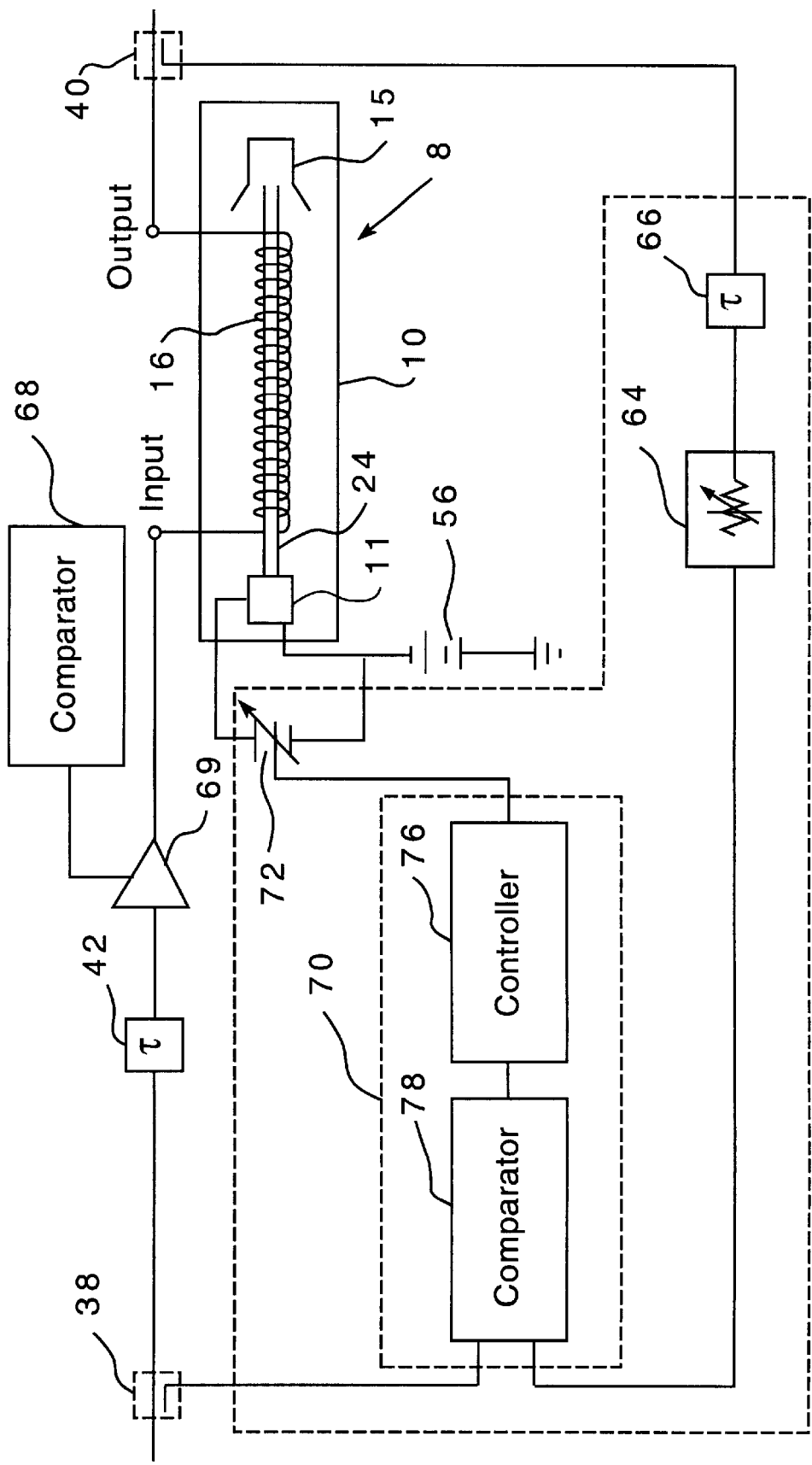
FIG. 11b is a combination schematic/block diagram of the electron beam control circuit of the amplifier system of FIG. 3 according to one embodiment of the present invention.

FIG. 11 is combination schematic/block diagram of the amplifier system 30 showing an embodiment of the electron beam control circuit 34. For purposes of clarity, the electron source voltage modulation circuit 32 and the linearization circuit 36 are not illustrated in FIG. 11. As illustrated in FIG. 11, the electron beam control circuit 34 may include a control circuit 70 and a variable power source 72. The control circuit 70 in the illustrated embodiment includes a controller 76 having an input terminal coupled to the output terminal of the power detector 48 and an output terminal coupled to the electron source 11 of the tube device 8 via the variable power source 72.

The control circuit 70 according to such an embodiment may be utilized, for example, to control the amplitude distortion of the input signal as it is amplified by the non-linear tube device 8. The amplitude distortion of the input signal by the tube device 8 is related to the current of the electron beam 24 generated by the electron source 11. The current of the electron beam 24 may be increased by increasing the number of electrons emitted from the electron source 11. According to one embodiment, the current of the electron beam 24 may be increased by, for example, increasing a voltage applied to the focusing electrodes 22 of the electron source 11 relative to the cathode 20. Alternatively, the current of the electron beam 24 may be increased by increasing the voltage applied to the grid(s) 21 relative to the cathode 20. The variable power source 72 provides variable power to either the focusing electrodes 22 or the grid(s) 21 of the electron source 11 based on the control signal provided by the controller 76, which is a function of the power level of the input signal.

As described hereinbefore, the power detector 48 may output a signal representative of the power of the amplitude modulated input signal. Based on the input from the power detector 48, the controller 76 may output the appropriate control signal to the electron source 11 to affect the current of the electron beam 24 generated by the electron source 11. According to one embodiment, the controller 76 may be coupled to the focusing electrodes 22 of the electron source 11 to modulate the voltage of the focusing electrodes 22 relative to cathode 20 to control the current of the electron beam 24 to compensate for the amplitude distortion caused by the non-linearity of the tube device 8. According to another embodiment, the output of the controller 76 may be coupled to the grid(s) 21. For such an embodiment, the control signal from the controller 76 may be a voltage signal which is applied to the grid(s) 21 to generated a voltage potential difference between the grid(s) 21 and the cathode 20 to dynamically compensate for the non-linear characteristics of the tube device 8. The voltage of the signal applied to the grid(s) 21 may depend upon the distance between the grid(s) 21 and the cathode 20, and may be on the order of, for example, 10 V.

For an embodiment in which the control signal is a voltage signal, the gain level of the controller 76 may depend upon the voltage of the output signal from the power detector 48 and the voltage required by either, for example, the focusing electrodes 22 or the grid(s) 21, to appropriately adjust the current of the electron beam 24 based on the characteristics of the tube device 8. For example, if the signal output from the power detector 48 needs to be attenuated to apply the appropriate voltage to either the focusing electrodes 22 or the grid(s) 21, the controller 76 may have a negative gain (in terms of dB). Conversely, if the signal output from the power detector 48 needs to be amplified to apply the appropriate voltage to either the focusing electrodes 22 or the grid(s) 21, the controller 76 may have a positive gain. The controller 76 may be tuned to the non-linear characteristics of the tube device 8 and the power detector 48 and may be, for example, a digital device or an analog device, as described hereinbefore with respect to the controller 50 of FIG. 4. According to another embodiment, the power detector 48 of the control circuit 70 of the amplitude distortion circuit 34 may be coupled to the output signal of the tube device 8 rather than the input signal.

According to another embodiment, as illustrated in FIGS. 11 a–b, the control circuit 70 may be coupled to both the input and the output signals of the tube device 8. According to such an embodiment, the control circuit 70 may include a comparator 78. The comparator 78 may compare the amplitudes of the input signal and the output signal, and output a signal to the controller 76 proportional to the phase difference. To harmonize the power between the input and output signals, the attenuation provided by the attenuator 64 (see FIG. 11a) may compensate for the gain provided by the tube device. The comparator 68, as described hereinbefore, may sample the input and output signals to adaptively modify the attenuation of the attenuator 64 to account for any fluctuation in the gain of the tube device 8. According to another embodiment, as discussed hereinbefore with respect to FIG. 9b, the pre-amplifier 69 (see FIG. 11b) may adaptively compensate for any fluctuation in the gain of the tube device.

Figure 12:
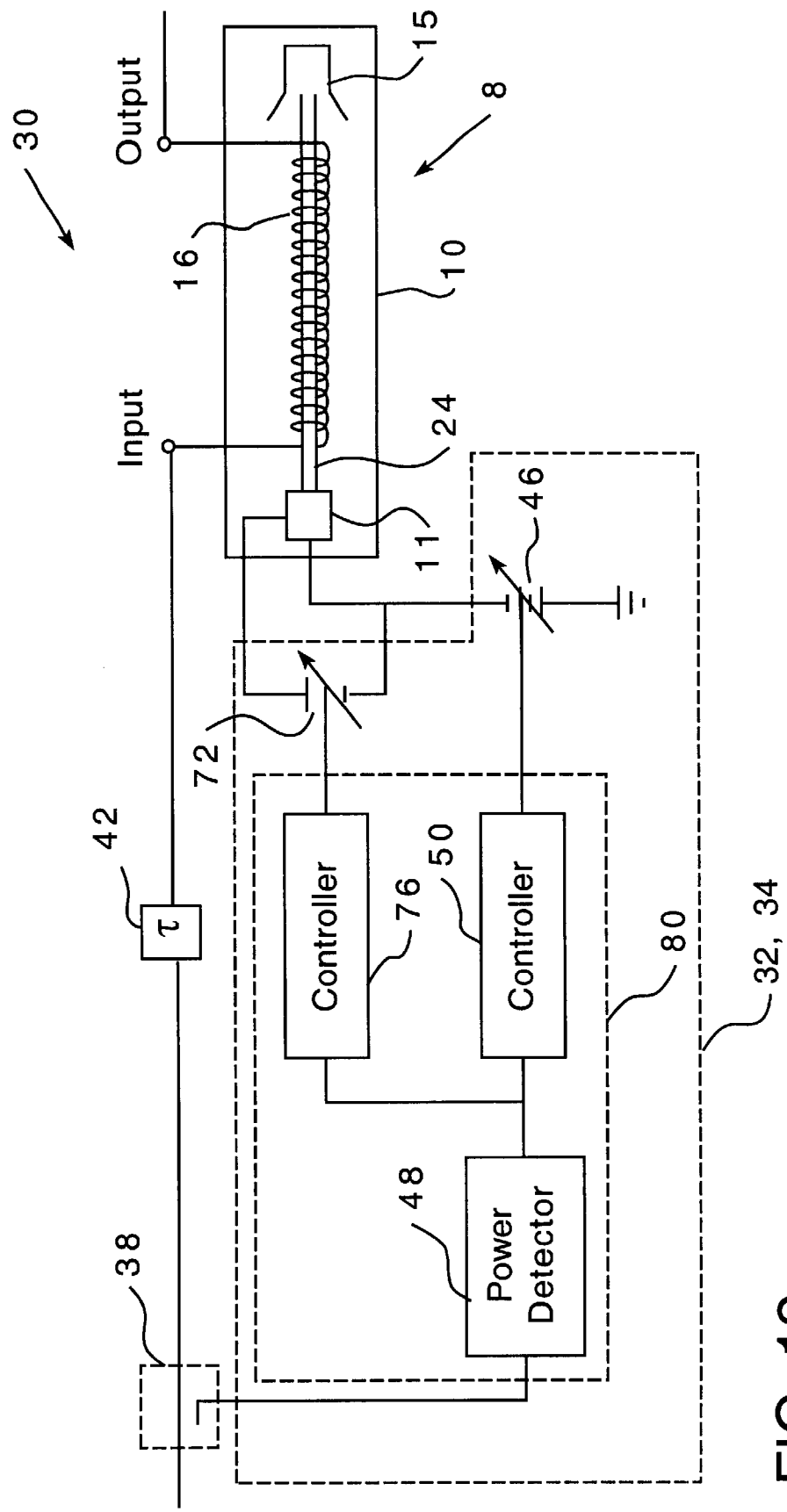
FIG. 12 is a combination schematic/block diagram of the electron source voltage modulation and the electron beam control circuits of the amplifier system of FIG. 3 according to one embodiment of the present invention.
Figure 13:
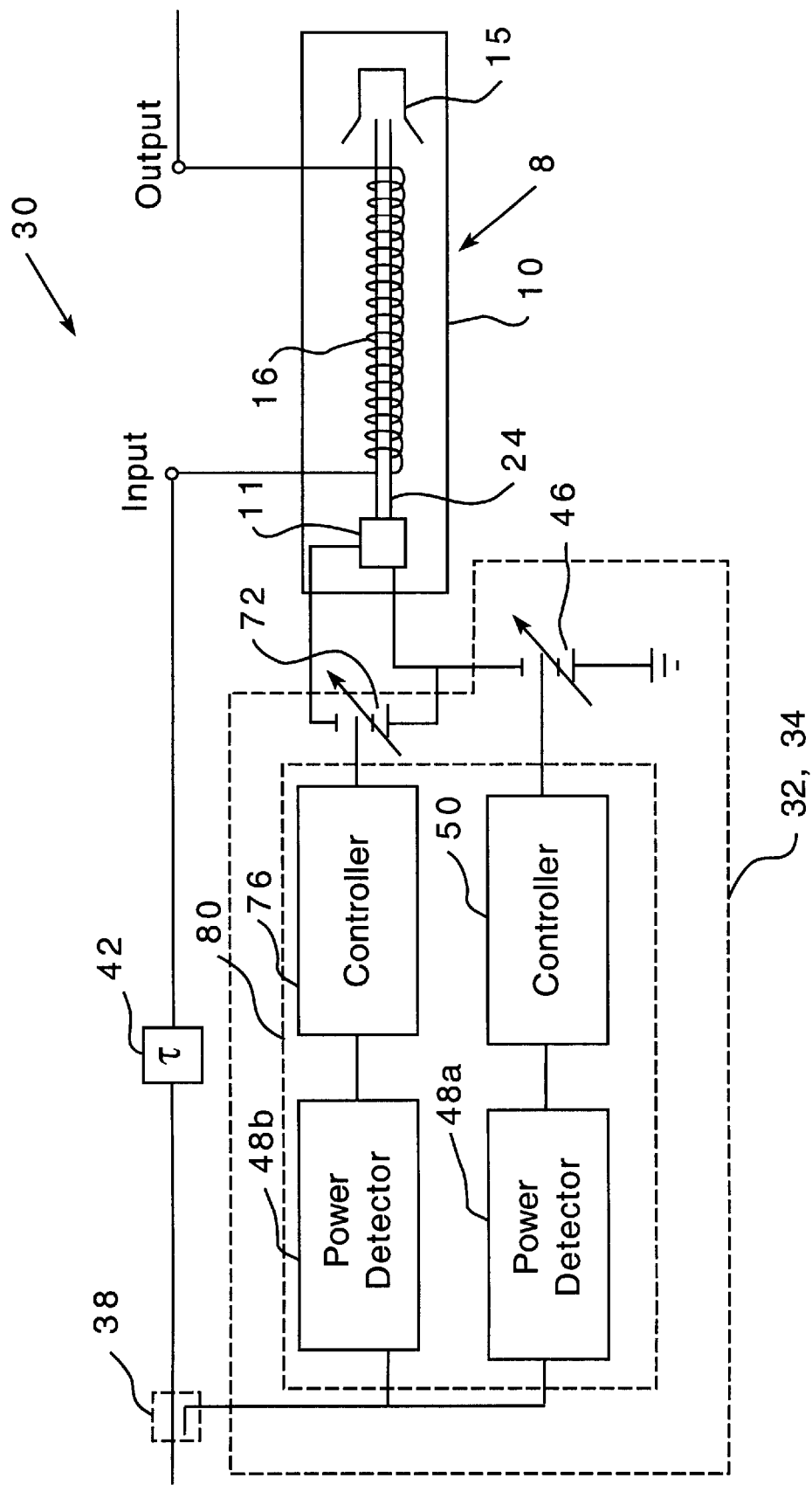
FIG. 13 is a combination schematic/block diagram of the electron source voltage modulation and the electron beam control circuits of the amplifier system of FIG. 3 according to another embodiment of the present invention.
Figure 14:
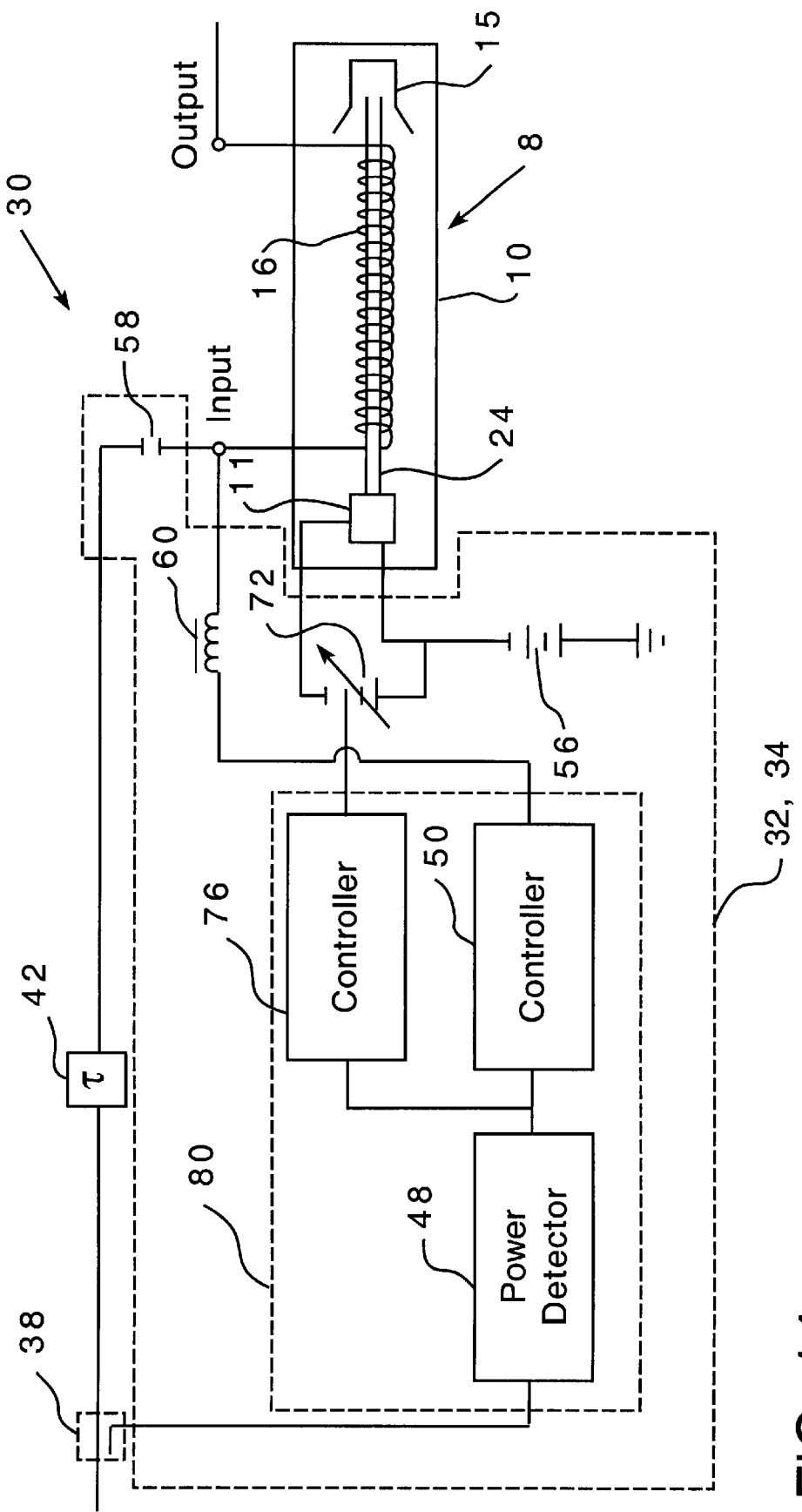
FIG. 14 is a combination schematic/block diagram of the electron source voltage modulation and the electron beam control circuits of the amplifier system of FIG. 3 according to another embodiment of the present invention.

FIGS. 12–14 are combination schematic/block diagrams of the amplifier system 30 of the present invention illustrating different embodiments for combinations of the electron source voltage modulation circuit 32 and the electron beam control circuit 34. For purposes of clarity, the linearization circuit 36 is not shown in FIGS. 12–14. As illustrated in FIG. 12, the electron source voltage modulation circuit 32 and the electron beam control circuit 34 may share a control circuit 80, including the power detector 48, the controller 50, and the controller 76.

As described hereinbefore, the power detector 48 may output a signal indicative of the power of the input signal. The controller 50 may generate the appropriate control signal to be applied to the cathode 20 of the electron source 11 via the variable power source 46 to modulate the voltage applied to the cathode 20 relative to the anode 23 based on the signal from the power detector 48, to control the kinetic energy of electrons emitted by the electron source 11, as described hereinbefore with respect to FIG. 4. In addition, the controller 76 may generate the appropriate control signal to be applied to, for example, the focusing electrodes 22 or the grid(s) 21 of the electron source 11, to modulate the current of the electron beam 24 generated by the electron source 11 to compensate for the amplitude distortion caused by the non-linearity of the tube device 8 based on the output signal from the power detector 48, as described hereinbefore with respect to FIG. 11. Thus, the control circuit 80 of the illustrated embodiment may be used to compensate for both the phase distortion and the amplitude distortion caused by the non-linearity of the tube device 8. According to another embodiment, the input terminal of the power detector 48 may be coupled to the output signal of the tube device 8, as described hereinbefore.

FIG. 13 is a combination schematic/block diagram of the amplifier system 30 according to another embodiment of the present invention. The amplifier system 30 illustrated in FIG. 13 is similar to that of FIG. 12, except that the control circuit 80 includes two power detectors 48*a,b*. Each of the power detectors 48*a,b* may be coupled to the input signal, and each may be respectively coupled to one of the controllers 50, 76 to provide phase and amplitude compensation as described hereinbefore with respect to FIG. 12. According to another embodiment, one or both of the power detectors 48*a,b* may be coupled to the output signal of the tube device 8, as described hereinbefore.

FIG. 14 is a combination schematic/block diagram of the amplifier system 30 according to another embodiment of the present invention. The amplifier system 30 illustrated in FIG. 14 is similar to that of FIG. 12, except that the control signal from the controller 50 is coupled to the helix 16 to modulate the voltage of the helix 16 relative to the cathode 20 to control the kinetic energy of electrons emitted by the electron source 11, and thereby compensate for phase distortion caused by the non-linearity of the tube device 8, as described hereinbefore with respect to FIG. 6. According to another embodiment, the input terminal of the power detector 48 may be coupled to the output signal of the tube device 8. According to yet another embodiment, the control circuit 80 may include two power detectors 48*a,b* rather than one, as described hereinbefore with respect to FIG. 13, wherein each of the power detectors 48*a,b* may be respectively coupled to one of the controllers 50, 76. For such an embodiment, one or both of the power detectors 48*a,b* may be coupled to the output signal of the tube device 8 rather than the input signal.

FIGS. 15–21 are diagrams of the amplifier system 30 of the present invention showing different embodiments for the linearization circuit 36. For purposes of clarity, the electron source voltage modulation circuit 32 and the electron beam control circuit 34 are not shown in FIGS. 15–21.

Figure 15:
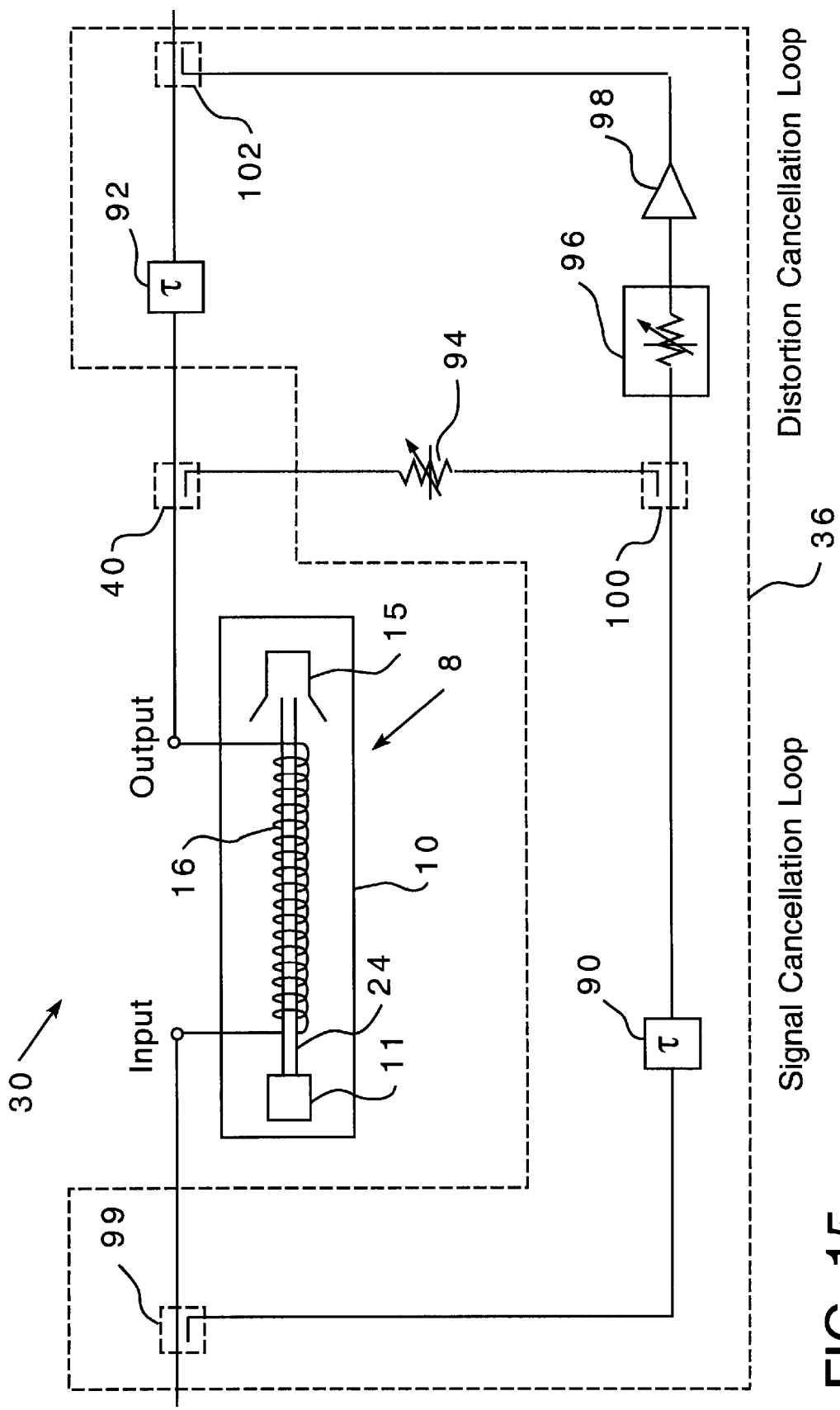
FIG. 15 is a combination schematic/block diagram of the linearization circuit of the amplifier system of FIG. 3 according to one embodiment of the present invention.

The linearization circuit 36 illustrated in FIG. 15 uses a non-adaptive feedforward technique to cancel distortion components generated by the tube device 8 at the output of the tube device 8, and includes delay lines 90, 92, attenuators 94, 96, and auxiliary amplifier 98. The auxiliary amplifier 98 may be, for example, a solid state amplifier. The feedforward linearization circuit 36 of FIG. 15 includes two loops, the first being the signal cancellation loop and the second being the distortion cancellation loop. A directional coupler 99 samples the distorted output from the tube device 8 and supplies the distorted output signal to the attenuator 96 and the auxiliary amplifier 98 via a coupler 100. The delay line 90 phase shifts the input signal to the tube device 180° such that the signals add out of phase at the coupler 100. Consequently, the resulting signal output from the coupler 100 is only the distortion caused by the tube device 8.

In the distortion cancellation loop, the delay line 92 shifts the output signal from the tube device 8 180° out of phase with respect to the lower path (i.e., the output from the coupler 100). The attenuator 96 and the auxiliary amplifier 98 in the lower path adjust the amplitude of the distortion components such that when the two signals are combined at the output coupler 102, the distortion components cancel and leave only the desired signal. According to another embodiment, the linearization circuit 36 may use an adaptive feedforward technique.

Figure 16:
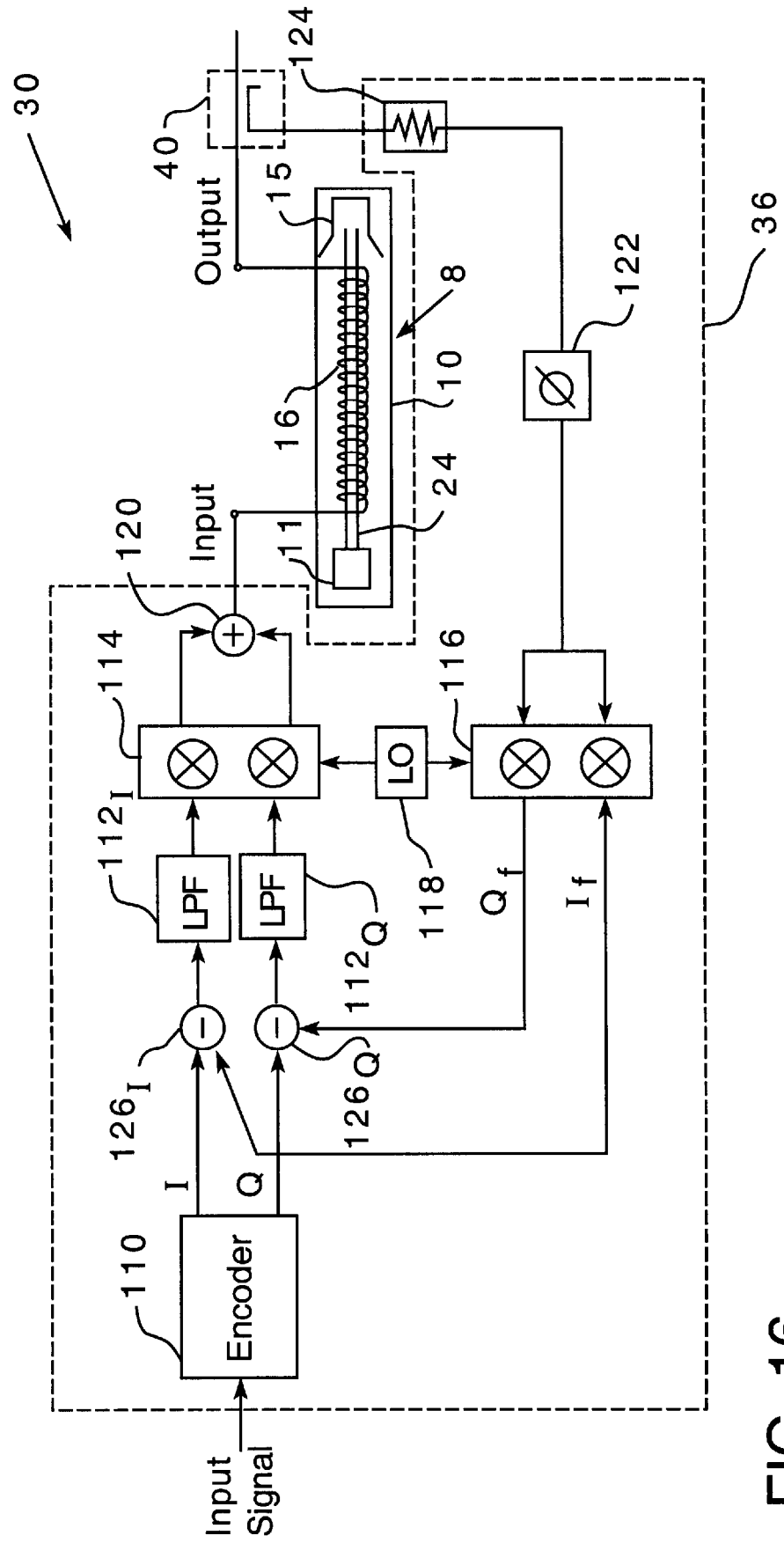
FIG. 16 is a combination schematic/block diagram of the linearization circuit of the amplifier system of FIG. 3 according to another embodiment of the present invention.

FIG. 16 is a combination schematic/block diagram of the amplifier system 30 of the present invention in which the linearization circuit 36 uses a Cartesian feedback technique to cancel distortion components at the input to the tube device 8. According to one embodiment, the Cartesian feedback linearization circuit 36 includes an encoder 110, a pair of low pass filters 112, a quad-modulator 114, and a quad-demodulator 116. Each of the quad-modulator 114 and the quad-demodulator 116 receive a mixing signal from a local oscillator 118.

The input signal is input to the encoder 110, which produces a pair of bit streams I and Q on separate channels. The I and Q channels are filtered respectively with the low pass filters $112_I$ and $112_Q$, and quad-modulated by quad-modulator 114. A combiner 120 sums the quad-modulated bit streams, which are input to the tube device 8. An upconverter (not shown) may be provided after the quad-modulator 114 to upconvert the frequencies of the signals input to the tube device 8 if necessary.

The directional coupler 40 at the output of the tube device 8 feeds a portion of the output signal of the tube device 8 to a feedback path. The feedback signal is phase and amplitude adjusted, by a phase shifter 122 and an attenuator 124 respectively, and quad-demodulated by quad-demodulator 116 to retrieve the feedback bit streams ($I_f$ and $Q_f$). The $I_f$ and $Q_f$ signals are then input to subtracters $126_{I,Q}$ to be subtracted from the I and Q bit stream output from the encoder 110.

Figure 17:
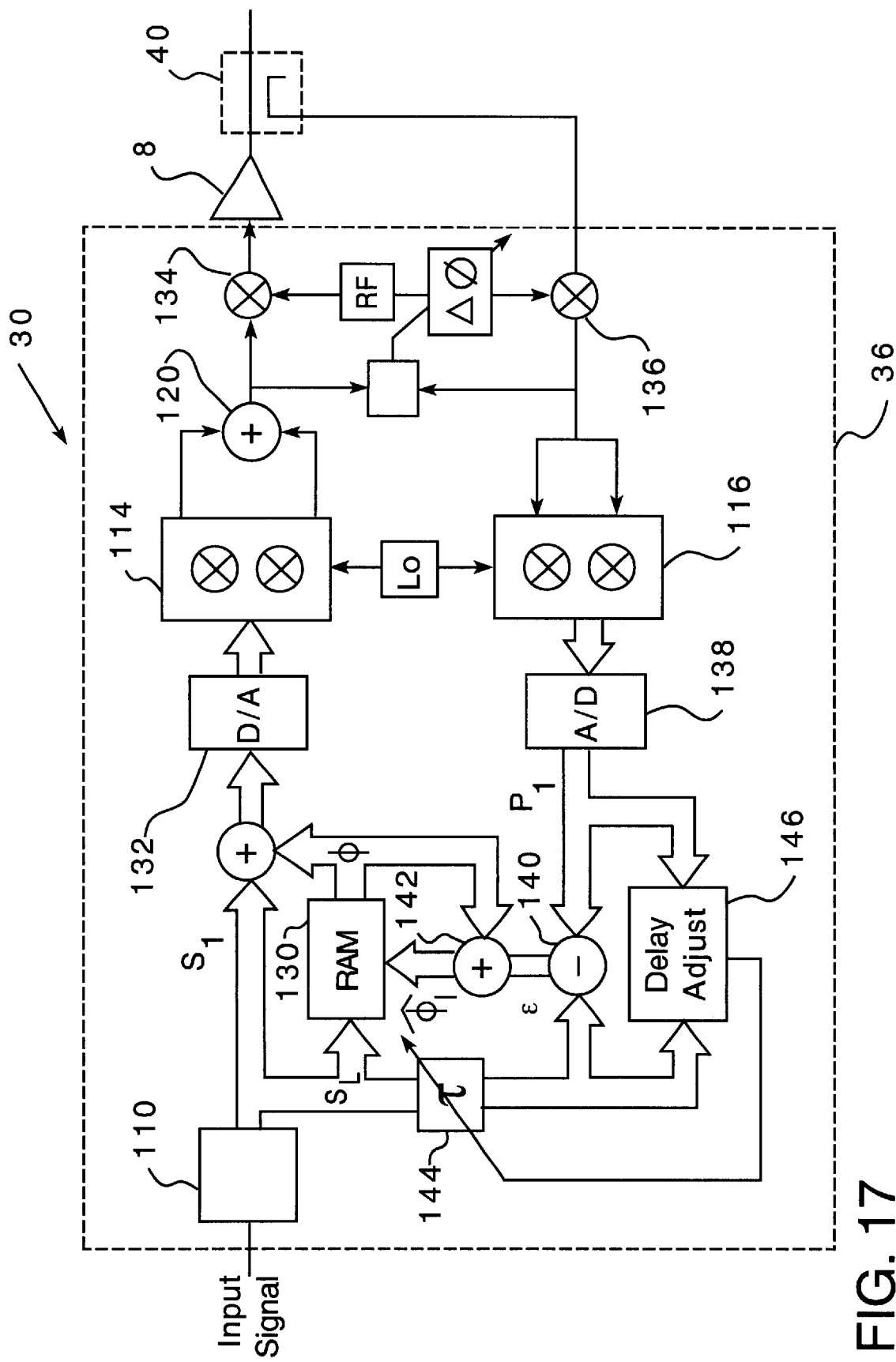
FIG. 17 is a combination schematic/block diagram of the linearization circuit of the amplifier system of FIG. 3 according to another embodiment of the present invention.

The Cartesian feedback linearization circuit 36 may be implemented in, for example, a DSP-based design. FIG. 17 is a block diagram of a DSP-based Cartesian feedback linearization circuit 36 according to one embodiment of the present invention. The DSP-based Cartesian feedback linearization circuit 36 includes a memory device 130 such as, for example, a random access memory (RAM), which stores predistortion values to compensate for the non-linear characteristics of the tube device 8 (depicted symbolically as an amplifier in FIG. 17). For example, the memory device 130 may include predistortion values to further compensate for the amplitude and phase distortion caused by the tube device 8. Consequently, using a DSP-based design, such as illustrated in FIG. 17, predistortion compensation can also be achieved.

The modulated data signals output from the encoder 110 in the forward path ($S_i$) are input to the memory device 130, which outputs a signal $\phi_i$ based on the predistortion values stored by the memory device 130. The signal $\phi_i$ is combined with $S_i$ and converted to analog by a D/A converter 132. The analog signal is quad modulated by the quad modulator 114 and up-converted to RF by a mixer 134. The output signal from the tube device 8 is coupled by the directional coupler 40 to the feedback path. The feedback signal is down-converted with a mixer 136 and demodulated by the quad demodulator 116. The feedback signal may then by digitized by an A/D converter 138. The digitized feedback signal ($P_i$) is compared with the digitized input signal ($S_i$) by a comparator 140, which produces an error signal $\epsilon$. The error signal $\epsilon$ is combined with the predistortion signal $\phi_i$ by a combiner 142, which produces an updating signal that is fed to the memory device 130 to update the predistortion values. The predistortion values of the memory device 130 may be updated iteratively with the number of iteration depending on the tube device's non-linear characteristics.

To compensate for the delay through the feedback path, the digitized input signal $S_i$ may be delayed by a delay path 144 before being input to the memory device 130. The delay of the delay path 144 may be adjusted based on the delay of the feedback path by delay and adjust circuit 146.

Figure 18:
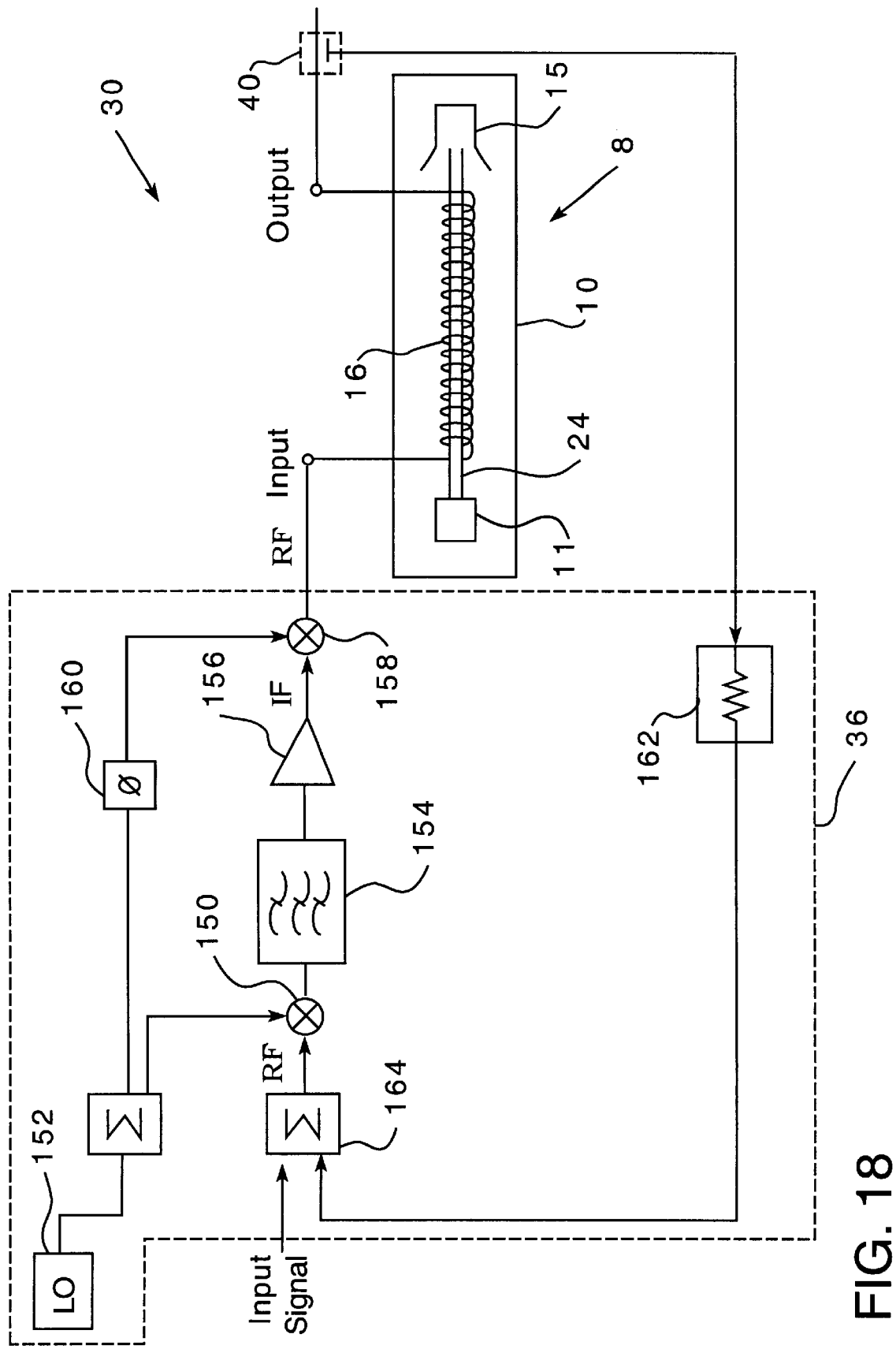
FIG. 18 is a combination schematic/block diagram of the linearization circuit of the amplifier system of FIG. 3 according to another embodiment of the present invention.

FIG. 18 is a combination schematic/block diagram of the amplifier system 30 of the present invention where the linearization circuit 36 employs an IF/RF feedback technique. According to one embodiment, the IF/RF feedback linearization circuit 36 includes two heterodyne stages which respectively down-convert and up-convert the input signal. The first heterodyne stage includes a mixer 150, which receives a mixing signal from a local oscillator 152 to down-convert the input signal to IF. Undesired frequency products of the first heterodyne stage are filtered by a band pass filter 154 and then amplified by an amplifier 156. The second heterodyne stage, including a mixer 158, which may be, for example, a single sideband mixer, up-converts the amplified IF signal to RF, which is then input to the tube device 8. A phase shifter 160 in the LO path phase shifts the mixing signal from the LO 152 used for up-conversion in the second heterodyne stage to ensure negative feedback. The output signal from the tube device 8 is fed back via the directional coupler 40 and attenuated by an attenuator 162 before being combined with the data input signal by a combiner 164.

Figure 19:
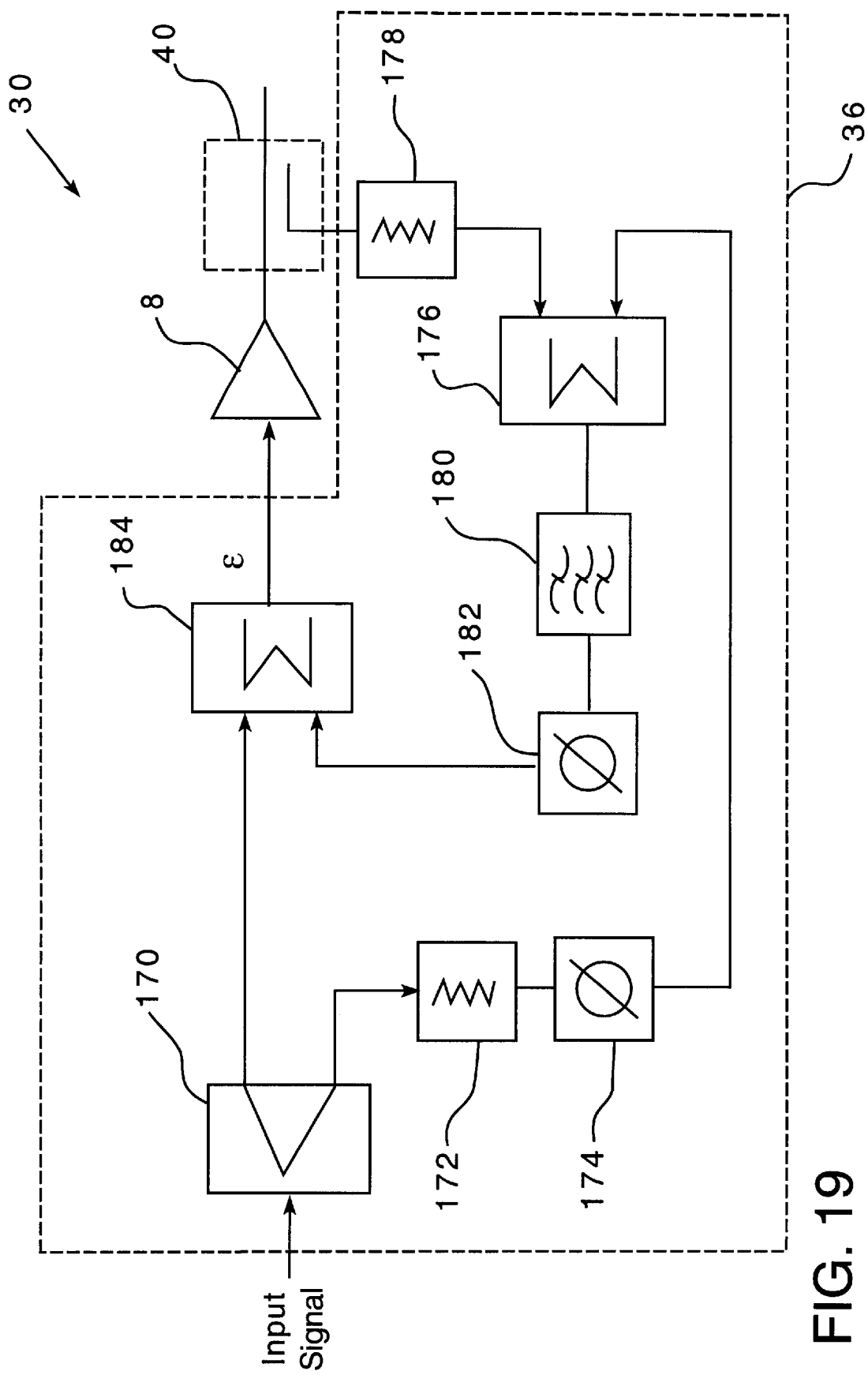
FIG. 19 is a combination schematic/block diagram of the linearization circuit of the amplifier system of FIG. 3 according to another embodiment of the present invention.

FIG. 19 is a block diagram of the amplifier system 30 according to another embodiment of the present invention in which the linearization circuit 36 utilizes a combination of feedback and feedforward linearization techniques. For the embodiment of the feedback/feedforward linearization circuit 36 illustrated in FIG. 19, the input signal is split by a splitter 170, which feeds an upper path and a lower path. The lower path is attenuated and phase shifted by an attenuator 172 and a phase shifter 174 respectively, and input to a combiner 176. The output signal from the tube device 8, sampled by the directional coupler 40, is also input to the combiner 176 after being attenuated by an attenuator 178. The output of the combiner 176 yields only the distortion components, which are then filtered by a band pass filter 180 and phase shifted by a phase shifter 182 before being combined with the upper path by a combiner 184. The combining of the upper path signal and the filtered distortion components by the combiner 184 yields an error signal $\epsilon$, which is input to the tube device 8.

Utilizing the feedback/feedforward linearization circuit 36 provides the advantage that the gain of the circuit is not reduced in the process as is the case with the closed loop processes of the feedback techniques, described hereinbefore. The lower combiner 176 cancels the main tones of the input signal, which allows an overall reduction of the intermodulation distortion at the distortion frequencies without affecting the gain of the tube device 8 at the fundamental frequencies. The filter 180 may be used to optimize the loop gain and stability for the circuit. According to one embodiment, the filter 180 may be a band pass butterworth filter with only one pole.

Figure 20:
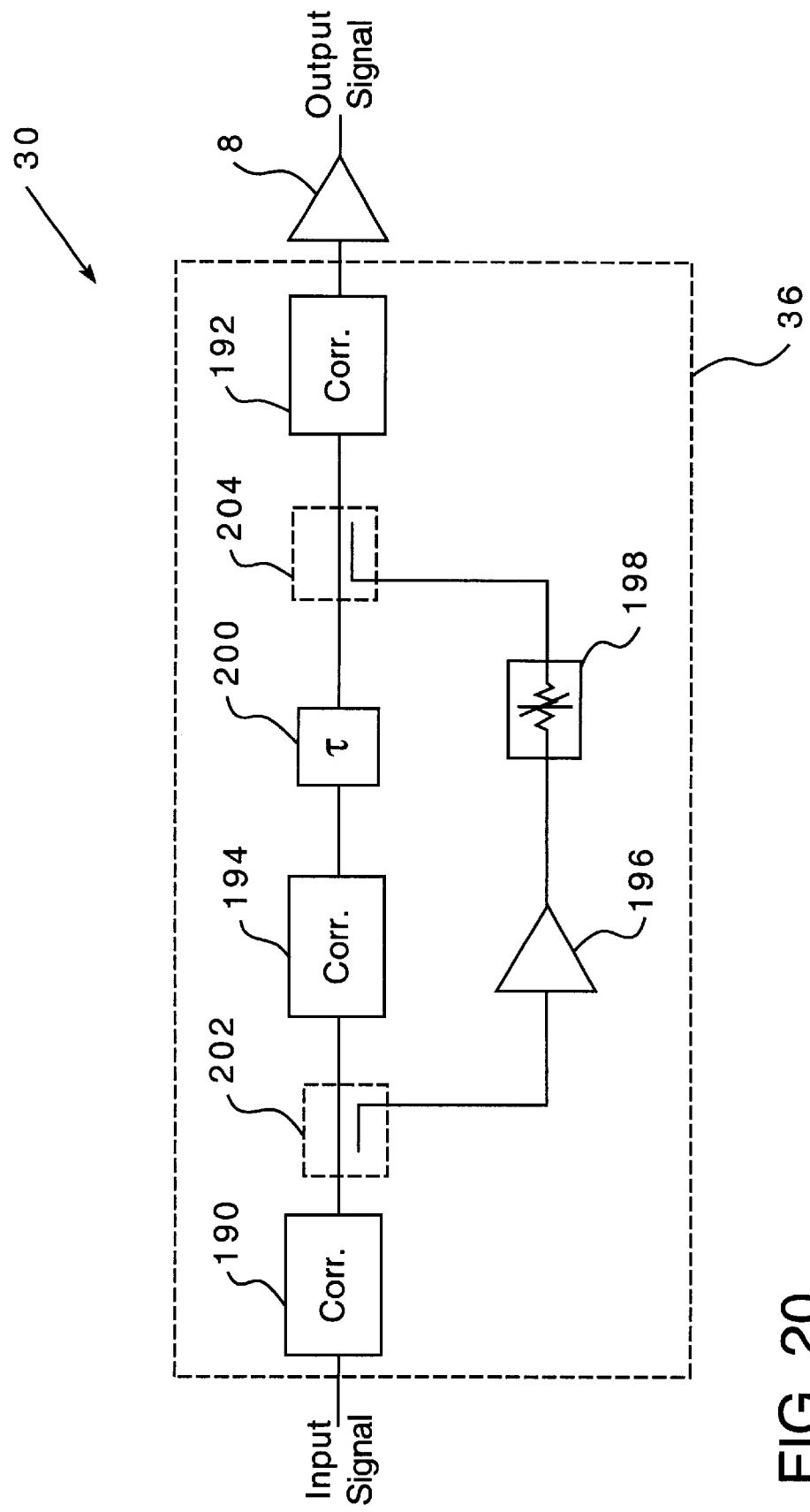
FIG. 20 is a combination schematic/block diagram of the linearization circuit of the amplifier system of FIG. 3 according to another embodiment of the present invention.

FIG. 20 is a combination schematic/block diagram of the amplifier system 30 according to another embodiment of the present invention in which the linearization circuit 36 utilizes the predistortion technique. According to the illustrated embodiment, the predistortion linearization circuit 36 includes two amplitude-frequency characteristic correctors 190, 192, a phase-frequency characteristic corrector 194, an auxiliary amplifier 196, an attenuator 198, and a delay line 200.

In operation, the input signal is input to the first amplitude-frequency characteristic correctors 190, the output of which is coupled to both the phase-frequency characteristic corrector 194 and the auxiliary amplifier 196 by a coupler 202. The coupler 202 may introduce a phase shift $\phi_1$ between the signals of the upper and lower paths. The auxiliary amplifier 196 may generate non-linearities which depend on the power level of the input signal, which are then attenuated by the attenuator 198 so that the output of the predistortion linearization circuit 36 can be varied without altering the gain of the auxiliary amplifier 196. The upper and lower signals are combined by a combiner 204, still with the phase shift $\phi_1$ between the signals. In addition, the combiner 204 may introduce an addition phase shift $\phi_2$. Each of the phase shifts $\phi_{1,2}$ may be, for example, 90°. The signal output by the combiner 204 is then fed to the second amplitude-frequency characteristic corrector 192. The predistorted input signal is then input to the tube device 8 for amplification.

Figure 21:
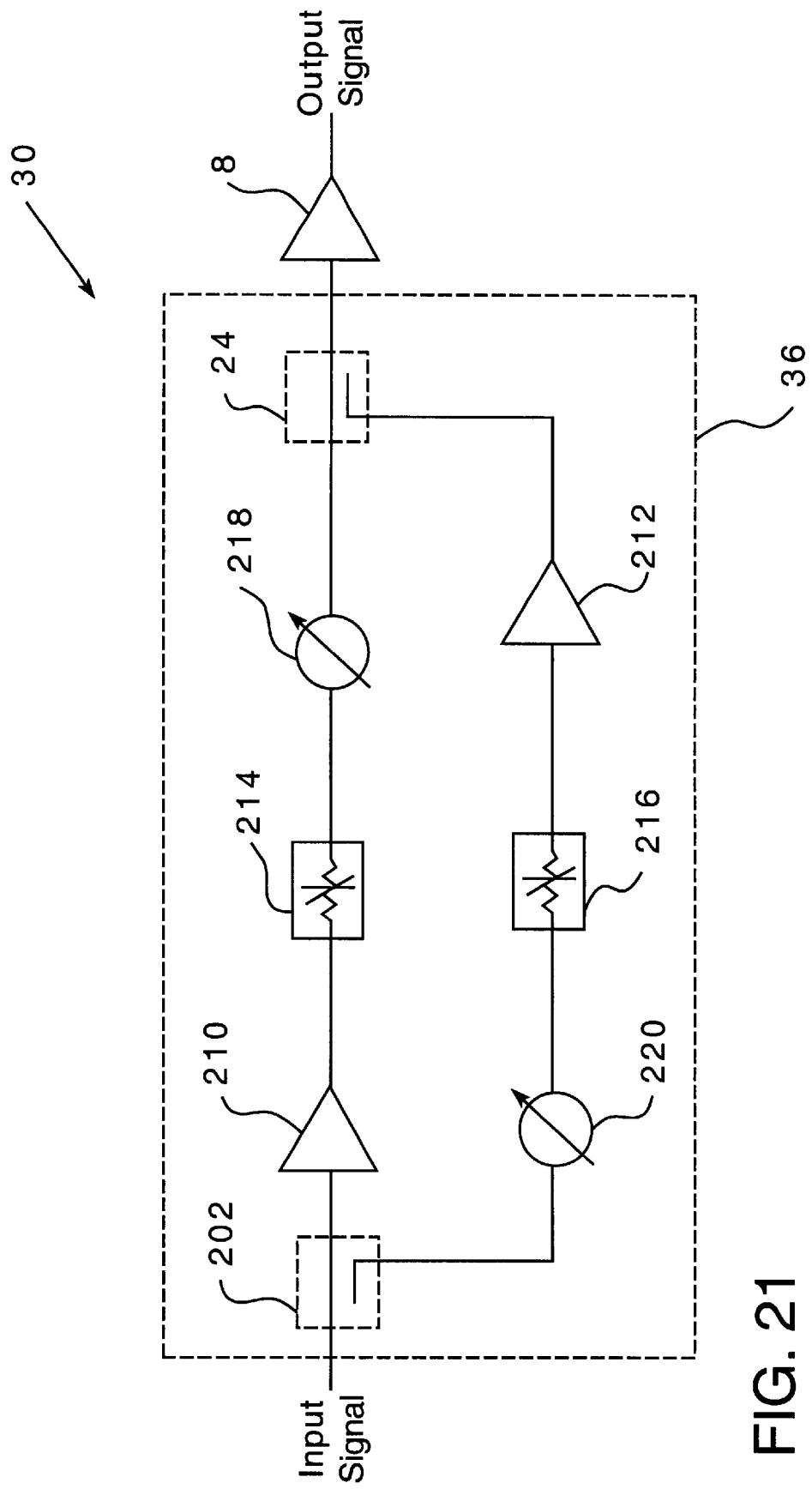
FIG. 21 is a combination schematic/block diagram of the linearization circuit of the amplifier system of FIG. 3 according to another embodiment of the present invention.

FIG. 21 is a combination block/schematic diagram of the amplifier system 30 in which the linearization circuit 36 utilizes the predistortion technique according to another embodiment of the present invention. The predistortion linearization circuit 36 illustrated in FIG. 21 includes a pair of auxiliary amplifiers 210, 212, a pair of attenuators 214, 216, and a pair of phase shifters 218, 220. The coupler 202 splits the input signal, feeding to both the upper and lower paths. The upper path signal is amplified by the amplifier 210, which may produce non-linear distortion of similar amplitude to the tube device 8. The upper path signal may then be attenuated and phase shifted by the attenuator 214 and the phase shifter 218 respectively. Similarly, the lower path signal may be phase shifted, attenuated, and amplified by the phase shifter 220, the attenuator 216, and the amplifier 212. The upper and lower signals may then be combined by the combiner 204, which outputs the predistorted signal to the tube device 8 for amplification.

Figure 22:
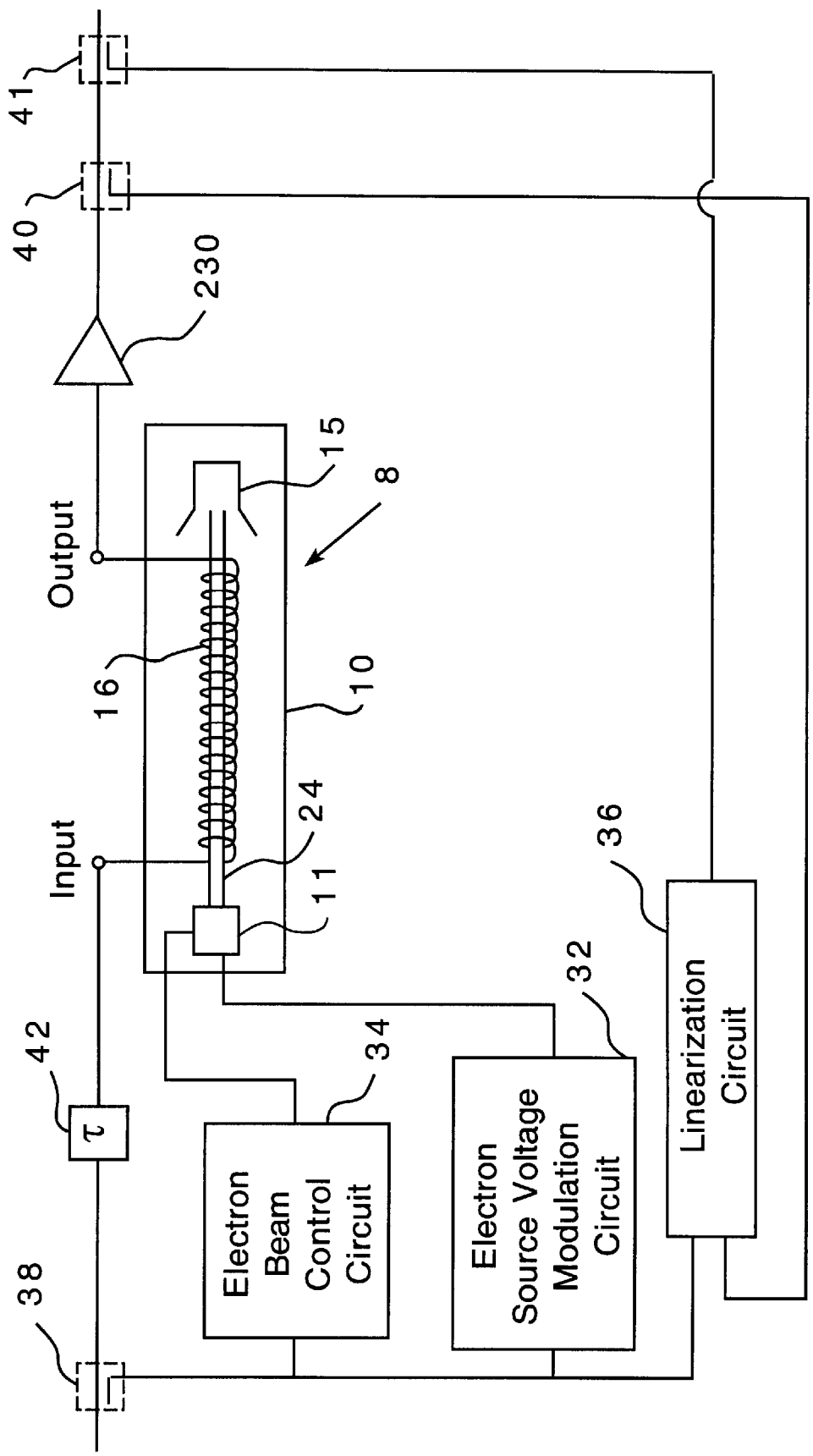
FIG. 22 is a combination schematic/block diagram of the amplifier system according to another embodiment of the present invention.

Benefits of the present invention may also be realized in connection with compensating for the non-linearity of a system of cascaded amplifiers. FIG. 22 is a diagram of the amplifier system 30 according to such an embodiment. The amplifier system 30 in FIG. 22 includes a second amplifier 230, which is driven by the tube device 8. The second amplifier 130 may be, for example, a high power vacuum tube amplifier or solid state amplifier. The tube device 8 and the second amplifier 230 may have similar characteristics of phase and amplitude gain over the dynamic range required by the amplifier system 30.

According to such an embodiment, the controller 50 of the electron source voltage modulation circuit 32 may modulate the voltage of either the electron source 11 or the interaction region 13 of the tube device 8, as described hereinbefore, to compensate for the cumulative phase non-linearity of both the tube device 8 and the second amplifier 230. Similarly, the controller 76 of the electron beam control circuit 34 may modulate the voltage of either the focusing electrodes or the grid(s) 21 of the electron source 11, as described hereinbefore, to compensate for the cumulative amplitude non-linearity of both the tube device 8 and the second amplifier 230. Although only two amplifiers are shown in FIG. 22, benefits of the present invention may be extended to more than two cascaded amplifiers in a similar fashion. However, if the cumulative time delay introduced by each amplification stage is too great, the bandwidth may not be sufficient for the feedback control.

The advantage provided by the linearization technique illustrated in FIG. 22 for cascaded amplifier systems is that less expensive components used. Because the driving amplifier (i.e., the tube device 8) typically operates at a much lower power that the second amplifier 230, the components used to modulate the voltages at the driving amplifier may have a lower power rating than if they modulated voltages at the second amplifier 230.

Although the present invention has been described with regard to certain embodiments thereof, those of ordinary skill in the art will recognize that many modifications and variations of the present invention may be implemented. For example, the electron source voltage modulation and electron beam control circuits described hereinbefore may be embodied in a single device, such as one DSP or ASIC having an input terminal coupled to the input signal and outputting one or two control signals. According to such an embodiment, the DSP or ASIC may perform the functions of both the power detector 48 and either or both of the controllers 50, 76. The foregoing description and the following claims are intended to cover all such modifications and variations.

What is claimed is:

1. An amplifier system, comprising:
   a vacuum tube amplifier having an input signal terminal and an output signal terminal;
   an electron source voltage modulation circuit having an input terminal coupled to one of the input signal terminal and the output signal terminal of the vacuum tube amplifier, and having an output terminal coupled to one of an electron source of the vacuum tube amplifier and an interaction region of the vacuum tube amplifier, wherein the electron source voltage modulation circuit includes:
      a power detector having an input terminal coupled to one of the input signal terminal and the output signal terminal of the vacuum tube amplifier, and having an output terminal; and
      a controller having an input terminal coupled to the output terminal of the power detector and an output terminal coupled to one of the electron source and the interaction region; and
   a linearization circuit coupled to the input signal terminal of the vacuum tube amplifier.

2. The amplifier system of claim 1, wherein the linearization circuit includes a circuit selected from the group consisting of a feedforward linearization circuit, a feedback linearization circuit, a feedforward/feedback linearization circuit, and a predistortion linearization circuit.

3. The amplifier system of claim 1, wherein the linearization circuit includes a Cartesian feedback linearization circuit.

4. The system of claim 1, wherein the controller includes:
   an amplifier having an input terminal coupled to the output terminal of the power detector and an output terminal coupled to one of the electron source and the interaction region; and
   a gain control circuit having an input terminal coupled to the output terminal of the power detector and an output terminal coupled to a gain control terminal of the amplifier.

5. The system of claim 1, wherein the controller includes a digital signal processor.

6. The system of claim 1, wherein the output terminal of controller is coupled to a cathode of the electron source.

7. The system of claim 6, wherein the output terminal of the controller is coupled to the cathode of the vacuum tube amplifier via a variable power source.

8. The system of claim 1, wherein the interaction region of the vacuum tube amplifier includes a helix, and the output terminal of the controller is coupled to the helix.

9. The system of claim 8, further comprising:
   a choke coupled between the output terminal of the controller and the helix; and
   a capacitor coupled to the input signal terminal of the vacuum tube amplifier.

10. An amplifier system, comprising:
    a vacuum tube amplifier having an input signal terminal and an output signal terminal;
    an electron source voltage modulation circuit having an input terminal coupled to one of the input signal terminal and the output signal terminal of the vacuum tube amplifier, and having an output terminal coupled to one of an electron source of the vacuum tube amplifier and an interaction region of the vacuum tube amplifier, wherein the electron source voltage modulation circuit includes:
       a comparator having a first input terminal coupled to the input signal terminal, a second input terminal coupled to the output signal terminal, and an output terminal; and
       a controller having an input terminal coupled to the output terminal of the comparator and an output terminal coupled to one of the electron source and the interaction region of the vacuum tube amplifier, and
    a linearization circuit coupled to the input signal terminal of the vacuum tube amplifier.

11. The amplifier system of claim 10, wherein the linearization circuit includes a circuit selected from the group consisting of a feedforward linearization circuit, a feedback linearization circuit, a feedforward/feedback linearization circuit, and a predistortion linearization circuit.

12. The amplifier system of claim 10, wherein the linearization circuit includes a Cartesian feedback linearization circuit.

13. The system of claim 10, wherein the output terminal of controller is coupled to a cathode of the electron source.

14. The system of claim 13, wherein the output terminal of the controller is coupled to the cathode of the vacuum tube amplifier via a variable power source.

15. The system of claim 10, wherein the interaction region of the vacuum tube amplifier includes a helix, and the output terminal of the controller is coupled to the helix.

16. The system of claim 15, further comprising:
    a choke coupled between the output terminal of the controller and the helix; and
    a capacitor coupled to the input signal terminal of the vacuum tube amplifier.

17. The system of claim 10, further comprising an electron beam control circuit having an input terminal coupled to one of the input signal terminal and the output signal terminal of the vacuum tube amplifier, and having an output terminal coupled to the electron source of the vacuum tube amplifier.

18. An amplifier system, comprising:
    a vacuum tube amplifier having an input signal terminal, an output signal terminal, and an electron source;
    an electron beam control circuit having an input terminal coupled to one of the input signal terminal and the output signal terminal of the vacuum tube amplifier, and having an output terminal coupled to the electron source of the vacuum tube amplifier, wherein the electron beam control circuit includes:
       a power detector having an input terminal coupled to one of the input signal terminal and the output signal terminal of the vacuum tube amplifier, and having an output terminal; and
       a controller having an input terminal coupled to the output terminal of the power detector and an output terminal coupled to the electron source; and
    a linearization circuit coupled to the input signal terminal of the vacuum tube amplifier.

19. The amplifier system of claim 18, wherein the linearization circuit includes a circuit selected from the group consisting of a feedforward linearization circuit, a feedback linearization circuit, a feedforward/feedback linearization circuit, and a predistortion linearization circuit.

20. The amplifier system of claim 18, wherein the linearization circuit includes a Cartesian feedback linearization circuit.

21. The system of claim 18, wherein the output terminal of the controller is coupled to a focusing electrode of the electron source.

22. The system of claim 18, wherein the output terminal of the controller is coupled to a grid of the electron source.

23. The system of claim 1, further comprising an electron beam control circuit having an input terminal coupled to one of the input signal terminal and the output signal terminal of the vacuum tube amplifier, and having an output terminal coupled to the electron source of the vacuum tube amplifier.

24. An amplifier system, comprising:
- a vacuum tube amplifier having an input signal terminal and an output signal terminal;
- a second amplifier having an input signal terminal and an output signal terminal, wherein the input signal terminal of the second amplifier is coupled to the output signal terminal of the vacuum tube amplifier;
- an electron source voltage modulation circuit having an input terminal coupled to one of the input signal terminal of the vacuum tube amplifier and the output signal terminal of the second amplifier, and having an output teal coupled to one of an electron source of the vacuum tube amplifier and an interaction region of the vacuum tube amplifier; and
- a linearization circuit coupled to the input signal terminal of the vacuum tube amplifier.

25. The amplifier system of claim 24, further comprising an electron beam control circuit having an input terminal coupled to one of the input signal terminal of the vacuum tube amplifier and the output signal terminal of the second amplifier, and having an output terminal coupled to one of a focusing electrode of the electron source of the vacuum tube amplifier and a grid of the electron source of the vacuum tube amplifier.

26. An amplifier system, comprising:
- a vacuum tube amplifier having an input signal terminal and an output signal terminal;
- a second amplifier having an input signal terminal and an output signal terminal, wherein the input signal terminal of the second amplifier is coupled to the output signal terminal of the vacuum tube amplifier;
- an electron beam control circuit having an input terminal coupled to one of the input signal teal of the vacuum tube amplifier and the output signal terminal of the second amplifier, and having an output terminal coupled to one of a focusing electrode of an electron source of the vacuum tube amplifier and a grid of the electron source of the vacuum tube amplifier, and
- a linearization circuit coupled to the input signal terminal of the vacuum tube amplifier.

* * * * *

UNITED STATES PATENT AND TRADEMARK OFFICE
CERTIFICATE OF CORRECTION

PATENT NO.   : 6,498,532 B2
DATED        : December 24, 2002
INVENTOR(S)  : Yehuda G. Goren et al.

It is certified that error appears in the above-identified patent and that said Letters Patent is hereby corrected as shown below:

<u>Title page,</u>
Item [56], References Cited, U.S. PATENT DOCUMENTS, "3,119,969," delete "1/1964" and substitute therefore -- 9/1961 --

<u>Column 1,</u>
Line 32, delete "modem" and substitute therefore with -- modern --

<u>Column 19,</u>
Line 30, delete "teal" and substitute therefore with -- terminal --

<u>Column 20,</u>
Line 21, delete "teal" and substitute therefore with -- terminal --

Signed and Sealed this

Sixteenth Day of September, 2003

JAMES E. ROGAN
*Director of the United States Patent and Trademark Office*